(12) United States Patent
Kern et al.

(10) Patent No.: US 10,489,068 B2
(45) Date of Patent: Nov. 26, 2019

(54) MEMORY HAVING DIFFERENT RELIABILITIES

(71) Applicant: Infineon Technologies AG, Neubiberg (DE)

(72) Inventors: Thomas Kern, Aschheim (DE); Michael Goessel, Mahlow (DE); Albrecht Mayer, Deisenhofen (DE)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 15/670,436

(22) Filed: Aug. 7, 2017

(65) Prior Publication Data

US 2018/0052626 A1 Feb. 22, 2018

(51) Int. Cl.
| | | |
|---|---|---|
| *G11C 16/34* | (2006.01) | |
| *G06F 3/06* | (2006.01) | |
| *G06F 11/07* | (2006.01) | |
| *G06F 11/10* | (2006.01) | |
| *G11C 11/56* | (2006.01) | |

(52) U.S. Cl.
CPC .......... *G06F 3/0619* (2013.01); *G06F 11/073* (2013.01); *G06F 11/076* (2013.01); *G06F 11/079* (2013.01); *G06F 11/1072* (2013.01); *G11C 11/5628* (2013.01)

(58) Field of Classification Search
CPC ................................................. G11C 11/5628
USPC ........................................................ 714/733
See application file for complete search history.

(56) References Cited

U.S. PATENT DOCUMENTS

| | | | |
|---|---|---|---|
| 2008/0052447 A1* | 2/2008 | Sukegawa | G06F 13/1668 711/103 |
| 2009/0019321 A1 | 1/2009 | Radke | |
| 2013/0024605 A1 | 1/2013 | Sharon | |
| 2013/0318420 A1* | 11/2013 | Seol | G06F 11/1008 714/773 |
| 2014/0169102 A1 | 6/2014 | Sun et al. | |
| 2015/0186198 A1 | 7/2015 | Dong | |
| 2016/0098216 A1 | 4/2016 | Huang et al. | |
| 2016/0148702 A1* | 5/2016 | Karakulak | G11C 16/26 365/185.12 |
| 2016/0172021 A1 | 6/2016 | Ishizu | |
| 2016/0266824 A1* | 9/2016 | Niu | G06F 12/02 |

FOREIGN PATENT DOCUMENTS

JP  H08166910 A  6/1996

OTHER PUBLICATIONS

Lin, Shu et al. "Error Control Coding Fundamentals and Applications." Second Edition. Pearson 2004. 5 pages.
Lin, Shu et al. Chapter 6 Binary BCH Codes. 14 pages. 2004.

\* cited by examiner

*Primary Examiner* — Min Huang
(74) *Attorney, Agent, or Firm* — Eschweiler & Potashnik, LLC

(57) ABSTRACT

The disclosure proposes a circuit including a memory which has a multiplicity of memory cells, the memory having a first area and a second area, at least one memory cell comprising a part of the first area and a part of the second area, the first area having a lower reliability than the second area, and the circuit being set up in such a manner that first bits are stored in the first area and second bits are stored in the second area. A circuit for reading the memory and methods for writing to and reading the memory are also disclosed.

18 Claims, 15 Drawing Sheets

| $A_1$: | $v_1^{1cor}$ | $v_2^{1cor}$ | ... | $v_{16}^{1cor}$ | $C_1^1$ | $C_2^1$ | $C_3^1$ | $C_4^1$ |
|---|---|---|---|---|---|---|---|---|
| $A_2$: | $v_{17}^{1cor}$ | $v_{18}^{1cor}$ | ... | $v_{32}^{1cor}$ | $C_1^2$ | $C_2^2$ | $C_3^2$ | $C_4^2$ |
| ... | | | | | | | | |
| $A_{16}$: | $v_{241}^{1cor}$ | $v_{242}^{1cor}$ | ... | $v_{256}^{1cor}$ | $C_1^{16}$ | $C_2^{16}$ | $C_3^{16}$ | $C_4^{16}$ |
| $A_{17}$: | $v_1^{2cor}$ | $v_2^{2cor}$ | ... | $v_{16}^{2cor}$ | $C_1^{17}$ | $C_2^{17}$ | $C_3^{17}$ | $C_4^{17}$ |
| ... | | | | | | | | |
| $A_{32}$: | $v_{241}^{2cor}$ | $v_{242}^{2cor}$ | ... | $v_{256}^{2cor}$ | $C_1^{32}$ | $C_2^{32}$ | $C_3^{32}$ | $C_4^{32}$ |

| $d^1$ | $d^2$ | $d^3$ | $d^4$ | $d^5$ | $d^6$ | } 901 |
|---|---|---|---|---|---|---|
| $v_1 u_1^1$ | $v_1 u_1^2$ | $v_1 u_1^3$ | $v_9 u_1^4$ | $v_9 u_1^5$ | $v_9 u_1^6$ | |
| $v_2 u_2^1$ | $v_2 u_2^2$ | $v_2 u_2^3$ | $v_{10} u_2^4$ | $v_{10} u_2^5$ | $v_{10} u_2^6$ | |
| $v_3 u_3^1$ | $v_3 u_3^2$ | $v_3 u_3^3$ | $v_{11} u_3^4$ | $v_{11} u_3^5$ | $v_{11} u_3^6$ | |
| $v_4 u_4^1$ | $v_4 u_4^2$ | $v_4 u_4^3$ | $v_{12} u_4^4$ | $v_{12} u_4^5$ | $v_{12} u_4^6$ | } 902 |
| $v_5 u_5^1$ | $v_5 u_5^2$ | $v_5 u_5^3$ | $v_{13} u_5^4$ | $v_{13} u_5^5$ | $v_{13} u_5^6$ | |
| $v_6 c_1^1$ | $v_6 c_1^2$ | $v_6 c_1^3$ | $v_{14} c_1^4$ | $v_{14} c_1^5$ | $v_{14} c_1^6$ | |
| $v_7 c_2^1$ | $v_7 c_2^2$ | $v_7 c_2^3$ | $v_{15} c_2^4$ | $v_{15} c_2^5$ | $v_{15} c_2^6$ | |
| $v_8 c_3^1$ | $v_8 c_3^2$ | $v_8 c_3^3$ | $v_{16} c_3^4$ | $v_{16} c_3^5$ | $v_{16} c_3^6$ | |

MEMORY HAVING DIFFERENT RELIABILITIES

CROSS REFERENCE TO RELATED APPLICATIONS

This application claims priority to German Application number 10 2016 115 272.2 filed on Aug. 17, 2016, the contents of which are incorporated by reference in their entirety.

FIELD

This disclosure is directed to a memory and a method for storing a plurality of values in individual memory cells of a volatile or non-volatile memory.

BACKGROUND

It is known practive to store a lurality of values in individual memory cells of a volatile or non-volatile memory.

SUMMARY

The disclosure is directed to storing bits in a memory.

The disclosure includes a circuit that comprises a memory which has a multiplicity of memory cells. The memory has a first area and a second area, and at least one memory cell comprises a part of the first area and a part of the second area, wherein the first area has a lower reliability than the second area. The circuit is configured such that first bits are stored in the first area and second bits are stored in the second area.

The circuit may be, for example, a memory apparatus, possibly with additional wiring for writing and/or reading.

The first bits may also be considered to be a first piece of information and the second bits may also be considered to be a second piece of information. The first information may differ from the second information. For example, the first information may contain data and the second information may contain program code or vice versa. On account of its subdivision into two areas, for example LSB and MSB, the memory cell can be used to store the different information. The first area having the lower reliability can be provided with error correction, for example. The second area can also be provided with (possibly less complicated) error correction.

It is a development that the memory cells assume physical values on the basis of the digital values stored therein, frequency distributions of the physical values which correspond to different digital values in the second area having a smaller overlap than frequency distributions which correspond to different digital values in the first area.

Each digital value stored in an area of a memory cell corresponds (for example during reading) to a frequency distribution of physical values. In order to be able to therefore distinguish the stored digital value from another digital value with a high degree of certainty during reading, the frequency distributions of the physical values belonging to the two digital values preferably do not have an overlap or have only a small overlap. For the area which is intended to ensure the higher reliability, the digital values stored in this area are converted into physical values which are spaced sufficiently far apart from one another in order to achieve (more) reliable detection during reading.

Accordingly, it holds true for the digital values stored in the first area of lower reliability that the associated frequency distributions of the physical values belonging to these digital values may have a greater overlap. For example, error detection and/or error correction can be provided for these digital values which can be read with lower reliability from the first area (in comparison with the second area of higher reliability) in order to thus increase the reliability. It is naturally also possible to provide error detection and/or error correction for the second area.

The areas are, for example, MSBs or LSBs of the memory cells. For example, the LSBs may have a higher reliability than the MSBs provided that the frequency distributions of the digital values in which the LSBs are 0 differ from the frequency distributions of the digital values in which the LSBs are 1. This is the case when the frequency distributions do not have any overlaps. A plurality of frequency distributions in which the LSBs have the value 0 can therefore also be interpreted as the frequency distribution in which the LSB=0. A corresponding situation applies to LSB=1.

It is a development that more than two values can be stored for each memory cell.

In particular, it is an option that more than two bits, in particular more than four values, are stored for each memory cell.

It is a development that the memory is a non-volatile memory.

It is a development that a second bit exists for at least one first bit, which second bit is stored in the same memory cell of the memory.

It is a development that a second bit exists for each first bit, which second bit can be stored in the same memory cell of the memory.

It is a development that the first bits and the second bits are different.

It is a development that, in the error-free case, one of the first bits stored in the memory and/or one of the second bits stored in the memory is/are a bit of a code word of an error code.

The error code may be an error-detecting and/or error-correcting code.

It is a development that, in the error-free case, a code word of the error code can be determined on the basis of the first bits stored in the memory, address bits and/or bits derived from address bits.

In particular, the memory is therefore an addressable memory and the bits of the address or bits derived therefrom can be taken into account when determining the code word. Therefore, the first bits or some of the first bits, in conjunction with the address bits and/or the derived bits, constitute a code word in the error-free case. In contrast, if there is a writing error, this can be detected and possibly corrected on the basis of the error code.

In particular, it is an option that the address bits or the derived bits (from the address bits) are stored in the memory.

Address errors can be detected, for example, from the fact that a code word is not present.

It is a development that, in the error-free case, one of the first bits stored in the memory is a bit of a code word of a first error code.

It is a development that, in the error-free case, one of the second bits stored in the memory is a bit of a code word of a second error code.

It is a development that the first error code and the second error code are different or identical error codes.

It is a development that the first error code has a higher correction power than the second error code.

Since the first area has a lower reliability than the second area, the first error code can be designed in such a manner that it enables corresponding higher error correction than the second error code.

It is a development that the circuit is set up in such a manner that first bits corrected using the first error code are provided when reading the memory from the first area.

It is a development that the circuit comprises a further memory, the circuit being set up in such a manner that the corrected first bits are stored in the further memory.

It is a development that the circuit is set up in such a manner that the corrected first bits are coded using a further error code and are stored in the further memory.

In this case, it is advantageous that the bits which have been read from the first area of the (first) memory are stored, after correction with the first error code, in the further (second) memory again in a manner protected with the further error code. Despite the lower reliability of the first area of the first memory, it is therefore ensured with a high degree of probability that the first bits can be finally processed further in an error-free (possibly corrected) manner.

It is a development that in the error-free case, a code word of the further error code can be determined on the basis of the bits stored in the further memory, address bits and/or bits derived from address bits.

In particular, the memory is therefore an addressable memory and the bits of the address or bits derived therefrom can be taken into account when determining the code word. Therefore, the first bits or some of the first bits corrected using the first error code, in conjunction with the address bits and/or the derived bits, constitute a code word of the further error code in the error-free case. If there is a writing error, this can be detected and possibly corrected on the basis of the further error code when reading the data coded in this manner from the further memory.

In particular, it is an option that the address bits or the derived bits (from the address bits) are stored in the memory.

It is a development that the further memory is a volatile or non-volatile memory.

It is a development that the circuit is configured such that the memory cell of the memory is written to or read using at least three reference values $R_l$, $R_m$, $R_r$, where $R_l < R_m < R_r$, and a value z being stored in the memory cell. The value of one bit of the second bits is determined by comparing the value z with the reference value $R_m$, and the value of one bit of the first bits being determined by comparing the value z with the reference value $R_m$ and with at least one further reference value which differs from the reference value $R_m$.

It is a development that the memory cell is written to in such a manner that the following applies to the value z in the error-free case:

$$|R_l - z| < |R_m - z| \text{ for } z < R_m \text{ and}$$

$$|R_r - z| < |R_m - z| \text{ for } z > R_m.$$

A circuit is also disclosed, and comprises a memory which has a multiplicity of memory cells. The memory has a first area and a second area, with at least one memory cell comprising a part of the first area and a part of the second area. The circuit further comprises a first processing unit for the first area, the first processing unit reading and processing first bits from the first area, and a second processing unit for the second area, the second processing unit reading and processing second bits from the second area.

Therefore, there are two processing units which are responsible for reading the bits from the memory cells of the memory, one of the processing units reading and processing the bits from some of the memory cells. The processing may comprise, for example, error detection and/or error correction.

It is a development that error detection and/or error correction can be carried out using the first processing unit.

It is a development that the first bits read using the first processing unit are a code word of a first error code in the error-free case.

It is a development that error detection and/or error correction can be carried out using the second processing unit.

It is a development that the second bits read using the second processing unit are a code word of a second error code in the error-free case.

The first error code and the second error code may be identical or different error codes.

It is development that the first area has a lower reliability than the second area.

A method for storing bits in a memory is also stated, wherein the memory has a multiplicity of memory cells, and has a first area and a second area. At least one memory cell comprises a part of the first area and a part of the second area, wherein the first area has a lower reliability than the second area. The method comprises storing first bits in the first area and second bits in the second area.

It is a development that the memory cells assume physical values on the basis of the digital values stored therein, frequency distributions of the physical values which correspond to different digital values in the second area having a smaller overlap than frequency distributions which correspond to different digital values in the first area.

A method for processing bits from a memory is also proposed, wherein the memory has a multiplicity of memory cells, and wherein the memory has a first area and a second area. Further, at least one memory cell comprises a part of the first area and a part of the second area. The method comprises reading and processing first bits from the first area using a first processing unit, and reading and processing second bits from the second area using a second processing unit.

It is a development that the processing respectively comprises error detection and/or error correction.

It is noted that the circuit or the processing unit mentioned here may comprise, for example, a processor unit and/or an at least partially hard-wired or logical circuit arrangement which is set up, for example, in such a manner that the method as described herein can be carried out.

In particular, any type of processor or computer with accordingly required peripherals (memory, input/output interfaces, input/output devices, etc.) may be provided for the circuit and/or the processing unit.

The above explanations relating to the method accordingly apply to the apparatus and conversely the features of the method may be combined with the features of the apparatus (circuit).

Furthermore, the circuit may be implemented in one component or in a manner distributed in a plurality of components.

The above-mentioned object is also achieved by means of a system comprising at least one of the circuits described here.

Furthermore, in another embodiment the disclosure specifies a computer program product which can be directly loaded into a memory of a digital computer, comprising program code parts which are suitable for carrying out steps of the method described here.

In one embodiment the computer-readable storage medium comprises instructions which can be executed by a computer and are suitable for the computer to carry out the method(s) described here.

The above-described properties, features and advantages of this disclosure and the manner in which they are achieved are described below in connection with a schematic description of exemplary embodiments which are explained in more detail in connection with the drawings. In this case, identical or identically acting elements may be provided with identical reference symbols for clarity.

BRIEF DESCRIPTION OF THE DRAWINGS

In the drawings:

FIG. 6 shows an example diagram of a memory, wherein data can be stored in 64 memory cells for each address, and wherein each memory cell can store four different digital values;

FIG. 7 shows an alternative diagram of a memory, wherein data can be stored in 72 memory cells for each address, and wherein each memory cell can store four different digital values;

FIG. 8 shows an example diagram of a memory which can be provided as a second memory and is possibly used to store the LSBs read from a first memory;

FIG. 9 shows an example diagram of a first memory provided, by way of example, for the second memory according to FIG. 8;

DETAILED DESCRIPTION

Figure 1:
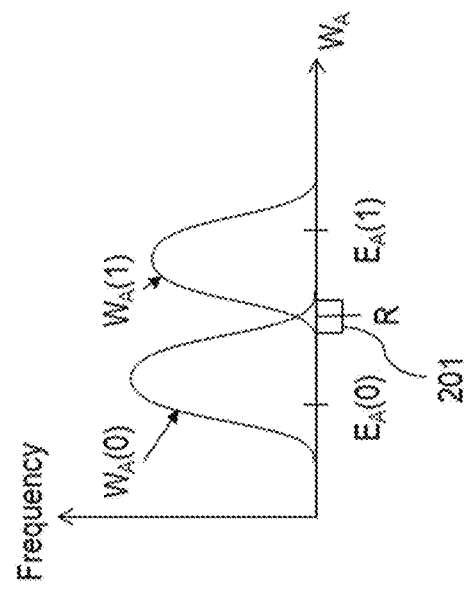
FIG. 1 shows a graph comprising two frequency distributions of analog values, which may be obtained when reading binary memory cells, and a reference value, the frequency distributions not having an overlap area.

A memory cell may assume different physical values or states which correspond to different digital values.

The following abbreviations, in particular, are used below:

G: a physical value, for example a current, a voltage, a resistance;
$W_G$: a physical value of a memory cell;
$W_D$: a digital value to be stored in a memory cell;
$W_A$: a physical value read from a memory cell;
LSB: the least significant bit;
MSB: the most significant bit.

It is possible, for example, for a physical value of a memory cell to be an electrical resistance. In this case, a larger resistance may correspond to a digital binary value 0 and a smaller resistance may correspond to a digital binary value 1. It is also possible for the larger resistance to correspond to the binary value 1 and for the smaller resistance to correspond to the binary value 0.

When storing or writing a piece of information in/to a memory cell, the physical value or state of the memory cell is determined in such a manner that it corresponds to the digital value to be stored.

It is possible, for example, for a duration of the operation of writing to the memory cell and/or for a writing current to determine the physical value $W_G$ or the state of the memory cell and therefore the digital value stored therein.

When reading the memory cell, it is possible to determine a physical analog value $W_A$ which depends on the state $W_G$ of the memory cell which was determined when writing the information to the memory cell. In the error-free case, the associated stored value $W_D$ results from the value $W_A$ which has been read. This value $W_D$ is also referred to herein as a digital value or binary value, by way of example.

If, for example, different electrical resistance values correspond to the different states, a current which depends on the resistance of the memory cell and therefore on the stored digital value may be output when reading the information stored in the memory cell. For example: $W_G$ is a resistance value, $W_A$ is a current intensity and $W_D$ is a binary value 0 or 1 (or another digital value).

When reading a piece of information from a memory cell, the value $W_A$ which has been read can be compared with a reference value R.

If a larger resistance corresponds to the binary value 0 and a smaller resistance corresponds to the binary value 1, the following results for the value $W_A$ of the current intensity which has been read: a smaller value of the current intensity corresponds to the binary value 0 and a larger value of the current intensity corresponds to the binary value 1.

Accordingly, a voltage can be determined when reading a memory cell, the level of which voltage depends on whether the binary value 0 or the binary value 1 has been previously written to the memory cell.

Alternatively, it is possible for a value of another physical variable to be determined during reading, which value depends on whether the binary value 0 or the binary value 1 has previously been written to the memory cell.

If the digital value $W_D$ is determined by comparing the value $W_A$ which has been read with the reference value R, the following may apply to the digital value $W_D$:

$$W_D = \begin{cases} 0 \text{ for } W_A < R \\ 1 \text{ for } W_A \geq R \end{cases}$$

If the binary value 0 is written to a plurality of memory cells, these memory cells assume different values of the physical value $W_G$, which are all assigned to the binary value $W_D=0$ in the error-free case, for example on account of random effects. The physical values $W_G$ can be described by means of a frequency distribution having a mean value or expected value $E_G(0)$. Accordingly, the values $W_A$ which are read from the memory cells also assume different values which can be described by means of a frequency distribution having an expected value $E_A(0)$.

This analogously applies to memory cells to which the binary value 1 is written. If the binary value 1 is written to a plurality of memory cells, these memory cells assume different values of the physical value $W_G$, which all correspond to the binary value $W_D=1$ in the error-free case and can be described by means of a frequency distribution having a mean value or expected value $E_G(1)$, for example on account of random effects. The values $W_A$ which are read from the memory cells also assume different values which can be described by means of a frequency distribution having an expected value $E_A(1)$.

These statements accordingly apply if it is possible to store more than one bit in a memory cell.

FIG. 1 shows, by way of example, two frequency distributions of analog values $W_A$ which can be obtained when reading binary memory cells. One frequency distribution $W_A(0)$ has an expected value $E_A(0)$ and one frequency distribution $W_A(1)$ has an expected value $E_A(1)$. The frequency distribution $W_A(0)$ corresponds to the digital value 0 and the frequency distribution $W_A(1)$ corresponds to the digital value 1.

The range of values of the possible physical values $W_A$ is subdivided into two ranges by means of a reference value R.

Since the frequency distribution $W_A(0)$ and the frequency distribution $W_A(1)$ do not overlap in the example shown in FIG. 1, incorrect assignment of the binary values 0 or 1 does not occur.

Figure 2:
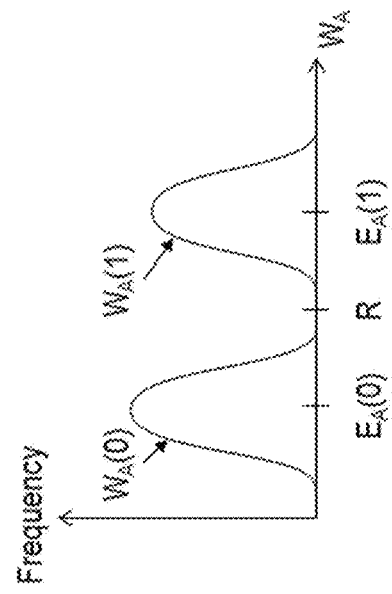
FIG. 2 shows a graph comprising two frequency distributions, which may be obtained when reading binary memory cells, and a reference value, the frequency distributions having an overlap area.

FIG. 2 shows, by way of example, two frequency distributions of analog values $W_A$ comprising a frequency distribution $W_A(0)$ and a frequency distribution $W_A(1)$ which are subdivided into two ranges by means of a reference value R. Again, the frequency distribution $W_A(0)$ corresponds to the binary value 0 and the frequency distribution $W_A(1)$ corresponds to the binary value 1. The frequency distributions $W_A(0)$ and $W_A(1)$ have an overlap area 201, also referred to as overlap area [0, 1]. For this overlap area 201, it is initially not clearly determined whether an analog value $W_A$ therein should be assigned to the binary value 0 or to the binary value 1.

If the binary value 0 is assigned to an analog value $W_A$ which has been read, if $W_A<R$, and if the binary value 1 is assigned, if $W_A \geq R$, it is possible that a value is stored as a binary value 0 or 1 is incorrectly read if the analog value $W_A$ is in the overlap area 201.

Figure 3:
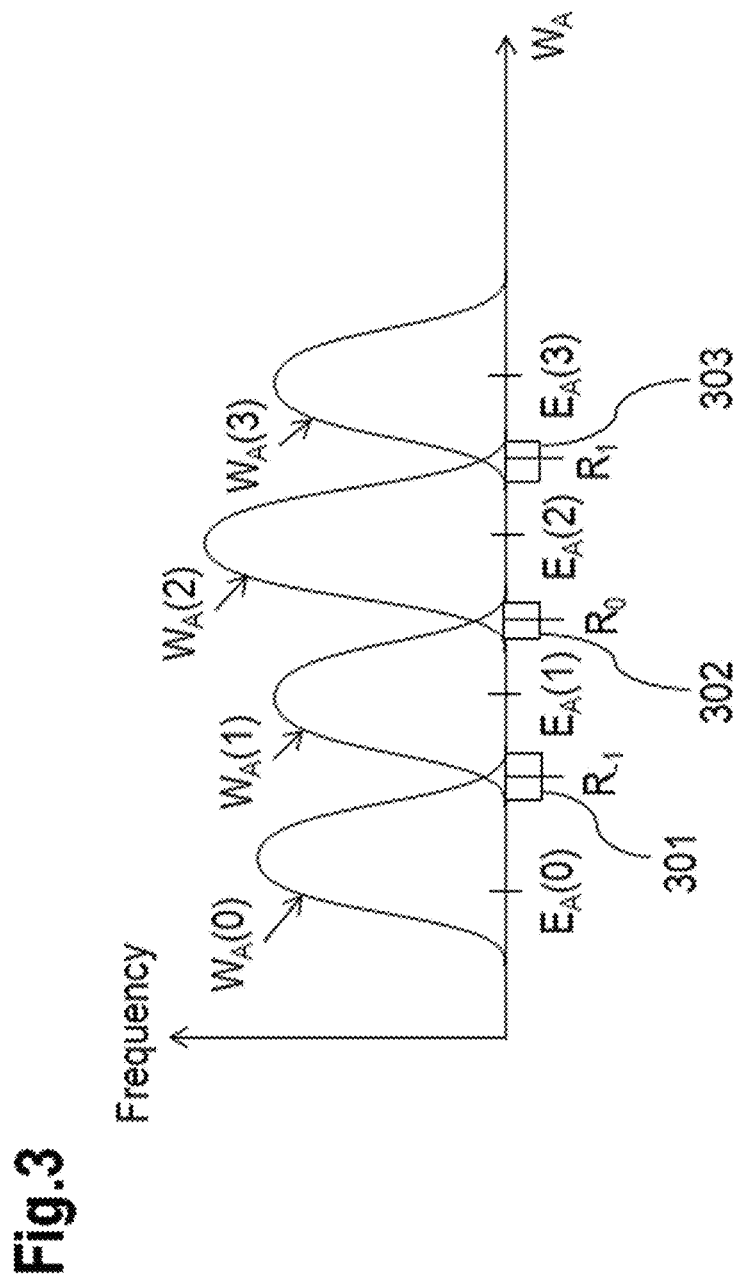
FIG. 3 shows a graph comprising four frequency distributions, which may be obtained when reading binary memory cells, and three reference values between each two of the frequency distributions and three overlap areas in the region of the reference values.

FIG. 3 shows, by way of example, frequency distributions of analog values $W_A$ which may be obtained when reading polyvalent memory cells (also referred to as multi-level memory cells). In this case, it is assumed that four different values 0, 1, 2 and 3 can be stored in a memory cell. Accordingly, the frequency distributions $W_A(0)$, $W_A(1)$, $W_A(2)$ and $W_A(3)$ are shown for these values in FIG. 3, wherein a reference value $R_{-1}$ is present in an overlap area 301 between the frequency distribution $W_A(0)$ and the frequency distribution $W_A(1)$, a reference value $R_0$ is present in an overlap area 302 between the frequency distribution $W_A(1)$ and the frequency distribution $W_A(2)$, and a reference value $R_1$ is present in an overlap area 303 between the frequency distribution $W_A(2)$ and the frequency distribution $W_A(3)$.

The range of values of the analog values $W_A$ is therefore subdivided into four ranges using the three reference values $R_0$, $R_1$ and $R_{-1}$, where: $R_{-1}<R_0<R_1$.

If the digital value $W_D$ is determined by comparing the analog value $W_A$ which has been read with the reference values $R_0$, $R_1$ and $R_{-1}$, the following applies according to the example shown in FIG. 3:

$$W_D = \begin{cases} 0 \text{ for } W_A < R_{-1} \\ 1 \text{ for } R_{-1} \leq W_A < R_0 \\ 2 \text{ for } R_0 \leq W_A < R_1 \\ 3 \text{ for } W_A \geq R_1 \end{cases}$$

In the example shown in FIG. 3, the frequency distributions overlap: the frequency distributions $W_A(0)$ and $W_A(1)$ overlap in the overlap area 301 for the analog values which correspond to the values 0 and 1; this overlap area 301 is also referred to as overlap area [0, 1]. The frequency distributions $W_A(1)$ and $W_A(2)$ overlap in the overlap area 302 for the analog values which correspond to the values 1 and 2; this overlap area 302 is also referred to as overlap area [1, 2]. The frequency distributions $W_A(2)$ and $W_A(3)$ overlap in the overlap area 303 for the analog values which correspond to the values 2 and 3; this overlap area 303 is also referred to as overlap area [2, 3].

On account of the overlap area 301, a value 1 may be incorrectly determined from the analog value which is read even though the value 0 was written to the memory cell. Conversely, a value 0 may be incorrectly determined from the analog value which is read even though the value 1 was written to the memory cell. Corresponding statements apply to the pairs of values [1, 2] and [2, 3].

If the overlap area 301 exists, it is possible for the reliability of the correct storage of the values 0 and 1 to be lower than if there were no overlap area 301. In particular, errors may arise when reading the memory; these errors are also referred to as read errors.

The relative frequency of an analog value $W_A(0)$ being in the overlap area 301 influences the reliability of the correct storage of the value 0. The relative frequency of an analog value $W_A(1)$ being in the overlap area 301 likewise influences the reliability of the correct storage of the value 1.

If no further errors have occurred, the reliability of the correct storage of the value 0 is determined by the relative frequency of the analog value $W_A(0)$ being in the overlap area 301. The following accordingly applies: if no further errors have occurred, the reliability of the correct storage of the value 1 is determined by the relative frequency of the analog value $W_A(1)$ being in the overlap area 301.

A corresponding situation applies to the reliability of the storage of all four digital values in a multi-level memory cell which can assume the four values 0, 1, 2 or 3. The reliability is influenced by the relative frequencies of the analog values $W_A(0)$, $W_A(1)$, $W_A(2)$ and $W_A(3)$ being in the corresponding overlap areas 301 to 303.

This approach can be expanded for any desired multi-level memory cells: the reliability of the storage of digital values in a multi-level memory cell having eight digital values 0, 1, 2, 3, 4, 5, 6 and 7 is thus influenced by the relative frequencies of the values $W_A(0)$, $W_A(1)$, ..., $W_A(7)$ being in the corresponding overlap areas [0, 1], [1, 2], [2, 3], [3, 4], [4, 5], [5, 6] and [6, 7].

The reliability of the storage of digital values in a multi-level memory cell for storing N digital values 0, 1, ..., N−1 generally depends on the relative frequencies of the analog values $$W_A(0), W_A(1), \ldots, W_A(N-1)$$

belonging to the corresponding N−1 overlap areas $$[0,1],[1,2],\ldots,[N-2,N-1]$$

with N=2, 3, ....

Figure 4:
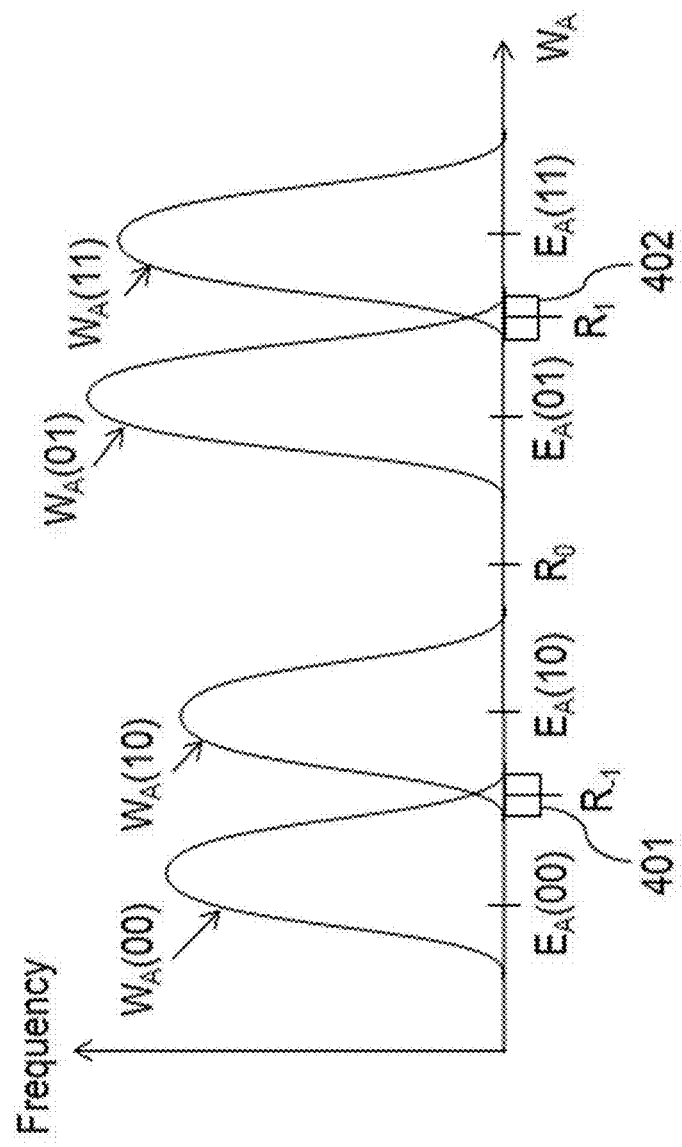
FIG. 4 shows a graph comprising four frequency distributions, which may be obtained when reading binary memory cells, and three reference values between each two of the frequency distributions and only two overlap areas.

FIG. 4 shows, by way of example, a plurality of frequency distributions $W_A(00)$, $W_A(10)$, $W_A(01)$ and $W_A(11)$ which result when four digital values 00, 10, 01 and 11 are stored in memory cells. The frequency distribution $W_A(00)$ has an expected value $E_A(00)$, the frequency distribution $W_A(01)$ has an expected value $E_A(01)$, the frequency distribution $W_A(10)$ has an expected value $E_A(10)$ and the frequency distribution $W_A(11)$ has an expected value $E_A(11)$.

Reference values $R_0$, $R_1$ and $R_{-1}$ are indicated, by way of example, in FIG. 4, wherein
- a reference value $R_{-1}$ is present in an overlap area 401 (also referred to as overlap area [00, 10]) between the frequency distribution $W_A(00)$ and the frequency distribution $W_A(10)$,
- a reference value $R_0$ is present between the frequency distribution $W_A(10)$ and the frequency distribution $W_A(01)$, and
- a reference value $R_1$ is present in an overlap area 402 (also referred to as overlap area [01, 11]) between the frequency distribution $W_A(01)$ and the frequency distribution $W_A(11)$, where the following applies:

$$E_A(00)<R_{-1}<E_A(10)<R_0<E_A(01)<R_1<E_A(11).$$

According to the example in FIG. 4, the digital value $W_D$ is written to a memory cell as an analog value $W_G$ such that the following applies to the expected values of the analog values which are read:

$$|E_A(01)-E_A(10)|>|E_A(11)-E_A(01)|$$

and $$|E_A(01)-E_A(10)|>|E_A(10)-E_A(00)|.$$

In FIG. 4, the frequency distributions $W_A(00)$ and $W_A(10)$ have the overlap area 401 and the frequency distributions $W_A(01)$ and $W_A(11)$ have the overlap area 402. In contrast, the frequency distributions $W_A(00)$ and $W_A(10)$ do not have an overlap area with the frequency distributions $W_A(01)$ and $W_A(11)$.

In this case, it is noted that the frequency distributions are illustrated in the explained examples in such a manner that an overlap area or no overlap area arises. In particular, for the embodiments shown here, a considerably smaller or weaker overlap area may be present for frequency distributions which have "no overlap area" than for the frequency distributions which have "an overlap area". In other words, with respect to the selected exemplary embodiments, "no overlap area" enables a considerably more reliable reading operation than if an overlap area is identified.

On account of the overlap area 401, it is possible for the digital value 00 to be written to the memory and to be incorrectly read as digital value 10 with a certain degree of probability. Conversely, it is possible for the digital value 10 to be written to the memory and to be incorrectly read as digital value 00.

On account of the overlap area 402, it is possible for the digital value 01 to be written to the memory and to be incorrectly read as digital value 11 with a certain degree of probability. Conversely, it is possible for the digital value 11 to be written to the memory and to be incorrectly read as digital value 01.

If there is no overlap area of the frequency distributions $W_A(00)$ and $W_A(10)$ with the frequency distributions $W_A(01)$ and $W_A(11)$ in the example shown in FIG. 4, the situation cannot occur in which a digital value 00 or 10 is written to the memory and a digital value 01 or 11 is incorrectly read provided that an additional error has not occurred.

The least significant bit (also referred to as LSB) of the digital values 00 and 10 is the right-hand bit which has the value 0, that is to say $$LSB(00)=LSB(10)=0.$$

The LSB of the digital values 01 and 11 is the right-hand bit which has the value 1, that is to say $$LSB(01)=LSB(11)=1.$$

The most significant bit (also referred to as MSB) of the digital value 00 is the left-hand bit having the value 0 and the MSB of the digital value 10 is the left-hand bit having the value 1, that is to say $$MSB(00)=0$$

$$MSB(10)=1.$$

The following accordingly applies:

$$MSB(01)=0$$

$$MSB(11)=1.$$

In the example shown in FIG. 4, the digital values are written to the memory cells in such a manner that they are stored with different reliability in memory cells. The distributions of the analog values $W_A(01)$ and $W_A(11)$, which correspond to the digital values 01 and 11 with the same LSBs $$LSB(01)=LSB(11)=1,$$

have the overlap area 402. A digital value 01 written to the memory can therefore be incorrectly read as value 11 or a digital value 11 written to the memory can be incorrectly read as value 01. In this case, the MSB changes and the LSB=1 does not change. Therefore, the error has an effect only in the MSB.

The digital values 00 and 10 are written to memory cells and stored in such a manner that the distributions of the analog values $W_A(00)$ and $W_A(10)$, which correspond to the digital values 00 and 10 with the same LSBs $$LSB(00)=LSB(10)=0,$$

have the overlap area 401. A digital value 10 written to the memory can therefore be incorrectly read as value 00 or a digital value 00 written to the memory can be incorrectly read as value 10. In this case, the LSB=0 does not change, with the result that the error has an effect only in the MSB.

Since the frequency distributions $W_A(00)$ and $W_A(10)$ of the digital values 00 and 10 with LSB=0 do not have an overlap area with the distributions $W_A(01)$ and $W_A(11)$ of the digital values 01 and 11 with LSB=1 in this example, a digital value which is written to the memory and has LSB=0 is not incorrectly read as a digital value with LSB=1 on account of the overlap of frequency distributions. A digital value which is written to the memory and has the LSB=1 is likewise not incorrectly read as a digital value with LSB=0 on account of the overlap of frequency distributions, with the result that the LSB is stored with a correspondingly high reliability.

In contrast, the MSB is stored with lower reliability since the frequency distributions $W_A(01)$ and $W_A(11)$ with different MSBs have the overlap area 402 and the frequency distributions $W_A(00)$ and $W_A(10)$ with different MSBs have the overlap area 401.

The LSB and the MSB can be written to the memory in successive steps. For example, it is thus possible to write those bits which require a particularly high reliability to memory cells as LSBs. For example, a program code can be represented by LSBs.

Image data which allow a lower reliability in comparison with the program code can be stored as MSBs, for example. If individual bits in the image data are incorrect, the image can still be successfully displayed or individual bit errors in an image display can remain undetected. In contrast, an individual incorrect bit in a program code may result in the entire program no longer being operational. Accordingly, other examples of more or less error-tolerant data are known and can be combined with the approach described here.

It is also an option that the reliability of the MSBs and/or LSBs, for example, can be increased by means of an error code. If the correction capability and/or the detection performance of the error code is/are accordingly powerful, the MSBs and/or LSBs can be stored, for example, with a predefinable (high) reliability using such error correction. The error codes for the error correction and/or error detection for the LSBs and/or MSBs may be identical or different.

It is assumed below, by way of example, that the corresponding analog value $W_A$ can be increased when writing a digital value to a memory cell. It can also be assumed, by way of example, that memory cells can be erased in blocks, in which case the corresponding analog value in the erased memory cell assumes a small, for example minimal, value during erasure. The block which can be erased in an erase operation comprises a plurality of bits. It is also possible for memory cells to be erased and/or overwritten individually or continuously (for example word-by-word).

For example, a memory cell which, according to the illustration shown in FIG. 4, can store four digital values 00, 10, 01 and 11 is considered. After a block has been erased, all cells in this block have analog values corresponding to the frequency distribution $W_A(00)$. This corresponds to the digital value 00 provided that no error has occurred.

Starting from the value 00, it is possible to store one of the values 00, 10, 01 or 11 in a memory cell. The state is not changed when writing the value 00. The analog value of the memory cell is increased when writing one of the values 10, 01 or 11. This is possible since the digital value 00 corresponds to the lowest analog value and the analog value $W_A$ can be increased starting from the digital value 00, with the result that the memory cell (in the error-free case) represents one of the values 10, 01 or 11.

In the example above, it was explained that four values (00, 10, 01, 11), by way of example, are represented by a memory cell. These four values are written to the memory cell in such a manner that a frequency distribution of the physically stored values results for each of the four values; the frequency distributions have partial overlaps. It is thus possible to use the range of values of the memory cell on the basis of the plurality of frequency distributions and to therefore enable a plurality of values to be stored in the memory cell. Each of the frequency distributions represents a physical value which can be assigned to one of the digital values (00, 10, 01, 11).

The frequency distribution $W_A(10)$ therefore corresponds to physical values which are read and are assigned to the digital value 10. This digital value 10 consists of two bits, the MSB with the value 1 and the LSB with the value 0.

When writing to the memory cell, the write voltage can be set in such a manner that the frequency distribution $W_A(10)$ around the expected value $E_A(10)$ results for the digital value 10 to be written.

A corresponding situation applies to the other digital values 00, 01 and 11. It is therefore determined during writing that the overlap area 401 arises between the digital values 00 and 10 and the overlap area 402 arises between the digital values 01 and 11. In contrast, there is no overlap area between the digital values 00 and 10 and the digital values 01 and 11. This means that the MSBs of the digital values are incorrect with a relatively high degree of probability, but the LSBs can be read in a (more) reliable manner.

The writing operation therefore specifies the practice of providing a higher reliability for some areas (here the LSBs of the memory cells) than for other areas (here the MSBs). Instead of the areas (LSBs, MSBs) described here by way of example, memory cells having a different subdivision may also be provided. In particular, it is possible to store more than four values. For example, $2^3=8$ values could be stored in digital values 000, 001, 010, 011, 100, 101, 110, 111, these digital values being mapped to the range of values of the physical values in such a manner that their respective frequency distributions do not have an overlap at least for one of the three bits.

In conventional memory cells of a flash memory, the different cell states are set using a threshold voltage $V_{th}$. In order to program a cell to a target threshold voltage $V_{th}$, a corresponding voltage $V_{CG}$ is applied to a control gate (CG) of the memory cell. The threshold voltage $V_{th}$ then follows this voltage $V_{CG}$ directly, for example, that is to say $$\Delta V_{th} = \Delta V_{CG}.$$

In order to achieve different reliabilities for the LSB and MSB, it is possible to select, for example, a threshold voltage $\Delta V_{th2}$ considerably greater than threshold voltages $\Delta V_{th1}$ and $\Delta V_{th3}$. A large signal-to-noise ratio and a higher reliability in comparison with shifts of the threshold voltages for the MSB (or LSB) and therefore a lower reliability for the LSB (or MSB) are therefore achieved.

Figure 11:
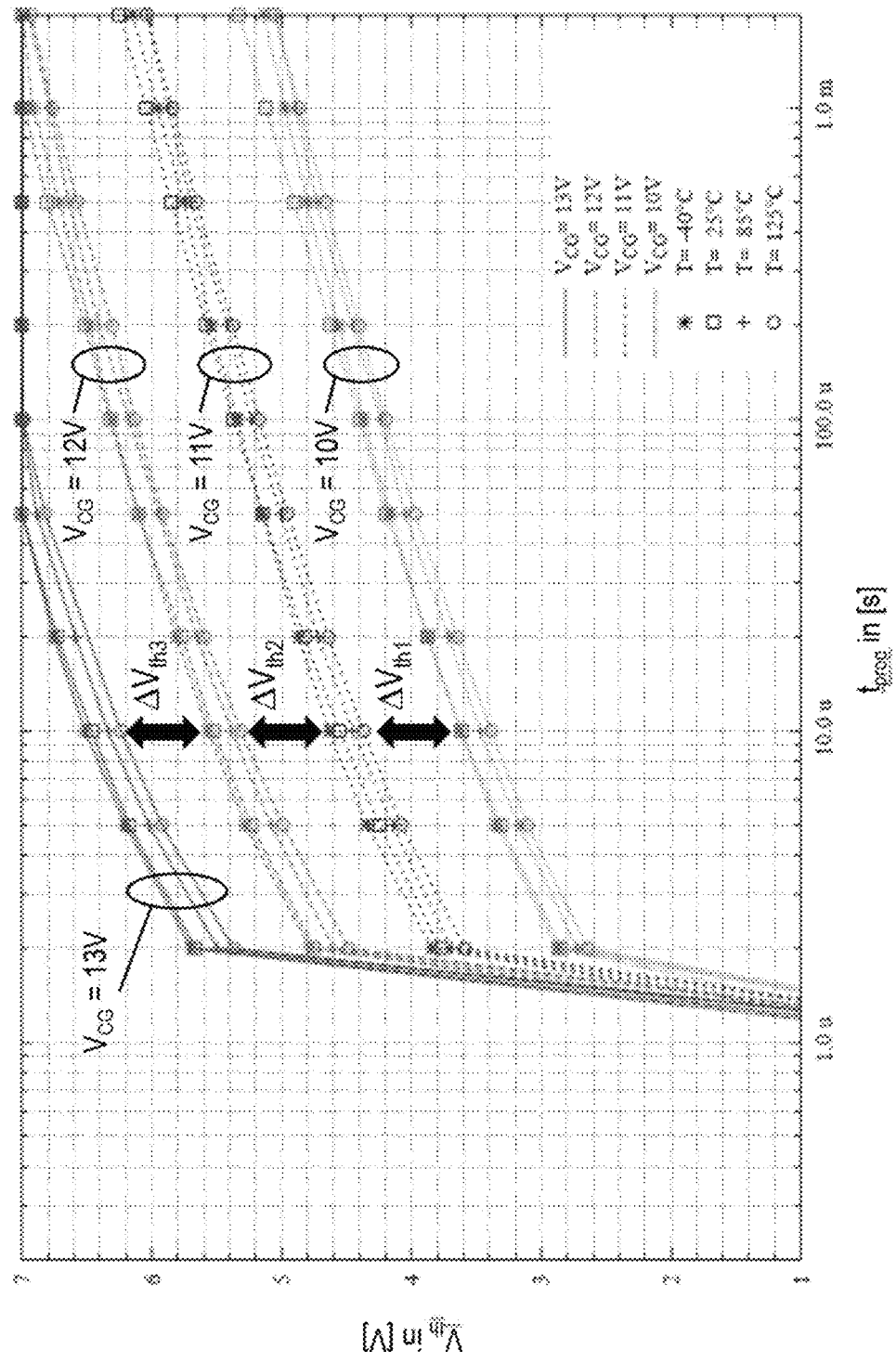
FIG. 11 shows a graph for illustrating the threshold voltage $V_{th}$ with regard to the voltage $V_{GS}$ at the control gate of the memory cell.

FIG. 11 shows, by way of example, a graph for illustrating the threshold voltage $V_{th}$ with respect to the voltage $V_{CG}$ at the control gate of the memory cell. A programming time is plotted on the x axis and the threshold voltage $V_{th}$ is plotted on the y axis. For a programming duration of 10 µs, the different threshold voltages $\Delta V_{th1}$, $\Delta V_{th2}$ and $\Delta V_{th3}$ are shown for the control gate voltages $V_{CG}$=10 V, 11 V, 12 V, 13 V.

It is therefore ensured, during writing, that the frequency distributions of the associated physical values (substantially) have no overlaps which would result in an ambiguity at least for some (here one bit) of the digitally represented values.

The following therefore applies to such a reliable bit which may have two values: the frequency distributions in which the reliable bit has the first value do not overlap frequency distributions in which the reliable bit has the second value. It is not important which value the at least one further (possibly more unreliable) bit has in this case. Therefore, the first value of the reliable bit can be distinguished from its second value with a high degree of certainty. This reliable bit can therefore be used in the memory cell to store information there only in the reliable bits of memory cells of the memory.

Accordingly, the lower reliability can be accepted for the unreliable bit (the MSB in the example) of the memory cell; the reliability can be improved by means of error correction. In particular, the error-corrected values can be written to a fast memory which is used during normal operation.

Writing sequence: LSB then MSB

One option is to write the value of the LSB to memory cells in a first writing operation and to then write any desired MSB to a memory cell, to which the LSB has already been previously written in the first writing operation, in a second writing operation.

If, for example, the value 0 of the LSB is to be stored in an erased memory cell, the value 00 is written to this memory cell. In this case, the analog value $W_A(00)$ of the memory cell is not changed.

If the value 1 of the LSB is to be stored in an erased memory cell, the value 01 is written to this memory cell which then assumes an analog value $W_A(01)$.

The MSB can now be stored as follows, depending on the situation:

The LSB with the value 0 was written in the first step, with the result that the digital value 00 is stored in the memory cell.

The MSB has the value 0. In this case, the memory cell is not written to and the stored digital value is still 00.

The MSB has the value 1. In this case, the value 10 is written to the memory cell.

The LSB with the value 1 was written in the first step, with the result that the digital value 01 is stored in the memory cell.

The MSB has the value 0. In this case, the memory cell is not written to and the stored digital value is still 01.

The MSB has the value 1. In this case, the value 11 is written to the memory cell.

When writing the MSB with the value 1, the state of the memory cell after the LSB has been written to it determines whether the digital value 10 or 11 is to be written to the memory cell. This operation of writing the MSB with the value 1 is therefore dependent on reading the previously written LSB of the memory cell. When writing the MSB with the value 0, it is not important what value was previously stored as the LSB. It is therefore possible to dispense with reading the value (of the LSB) stored in the memory cell in this case.

Writing sequence: MSB then LSB

It is also possible to initially write only the value of the MSB to memory cells in a first writing operation and then to write any desired LSB to one of the memory cells, to which the MSB has already been written in the first writing operation, in a second writing operation.

If, for example, the value of the MSB is equal to 0, the value 00 is written to this memory cell. If the value of the MSB is equal to 1, the value 10 is written to the corresponding memory cell.

The LSB can now be stored as follows, depending on the situation:

The MSB with the value 0 was written in the first step, with the result that the digital value 00 is stored in the memory cell.

The LSB has the value 0. In this case, the memory cell is not written to and the stored digital value is still 00.

The LSB has the value 1. In this case, the value 01 is written to the memory cell.

The MSB with the value 1 was written in the first step, with the result that the digital value 10 is stored in the memory cell.

The LSB has the value 0. In this case, the memory cell is not written to and the stored digital value is still 10.

The LSB has the value 1. In this case, the value 11 is written to the memory cell.

When writing the LSB with the value 1, the state of the memory cell after the MSB has been written to it determines whether the digital value 01 or 11 is to be written to the cell. This operation of writing the LSB with the value 1 is therefore dependent on reading the previously written MSB of the memory cell. When writing the LSB with the value 0, it is not important what value was previously stored in the memory cell as the MSB. In this case, it is not necessary to read the value of the previously stored MSB.

In this case, it is noted that it is also possible to directly write each of the digital values 00, 10, 01 or 11 to the erased memory cell. In particular, it is an option to write the digital value 00 to the memory cell even if the latter previously also had the value 00. In this respect, it is an alternative to the examples described above under numbers 1.1. and 2.1. that the value 00 is nevertheless written even if the previous state of the memory cell does not change thereby.

Further Example Frequency Distributions

Figure 5:
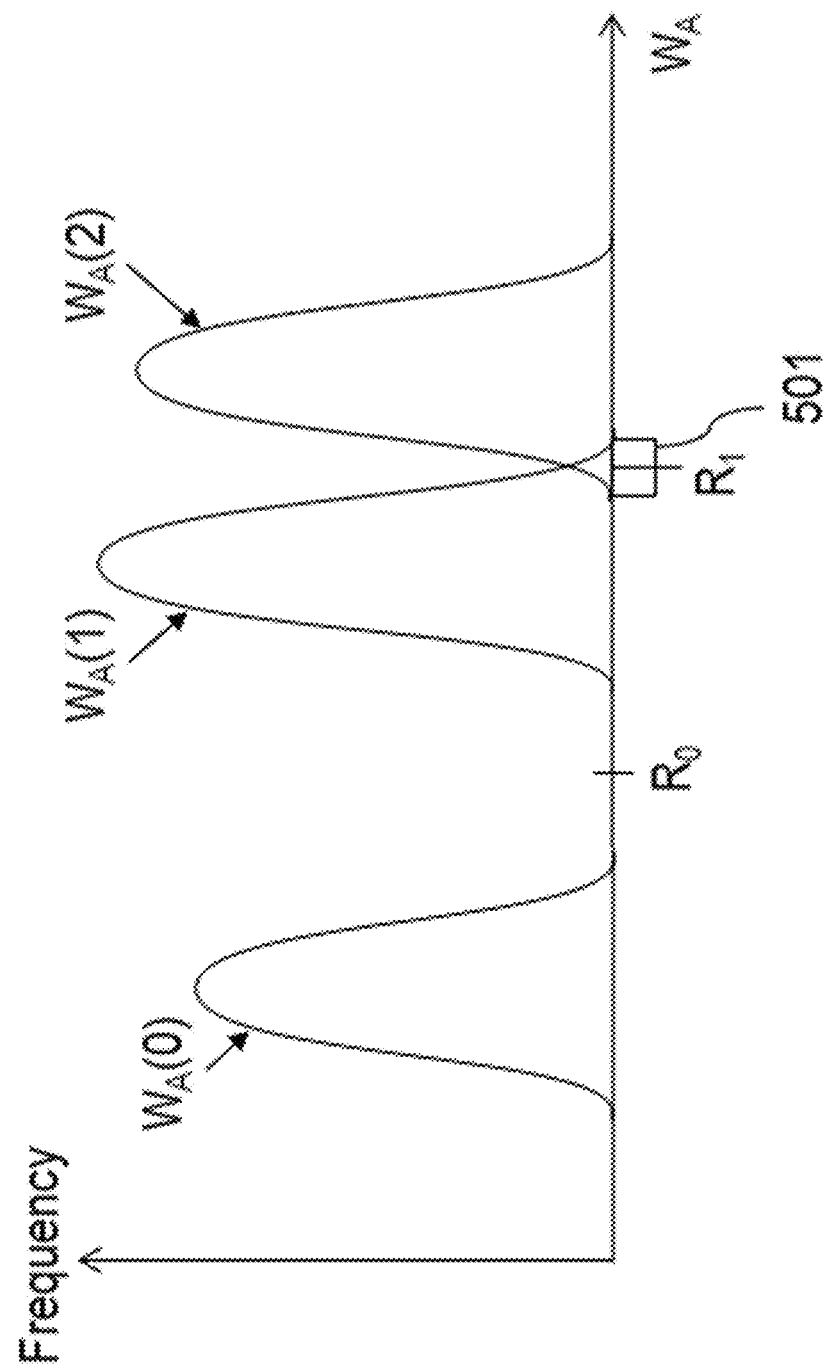
FIG. 5 shows a graph comprising three frequency distributions, which may be obtained when reading binary memory cells, and two reference values between each two of the frequency distributions and only one overlap area.

FIG. 5 shows example frequency distributions $W_A(0)$, $W_A(1)$ and $W_A(2)$ of analog values which may arise if three digital values 0, 1 and 2 are stored in memory cells. The frequency distribution $W_A(0)$ has an expected value $E_A(0)$, the frequency distribution $W_A(1)$ has an expected value $E_A(1)$ and the frequency distribution $W_A(2)$ has an expected value $E_A(2)$.

Reference values $R_0$ and $R_1$ are indicated, by way of example, in FIG. 5, wherein the reference value $R_0$ is present between the frequency distribution $W_A(0)$ and the frequency distribution $W_A(1)$, and the reference value $R_1$ is present in an overlap area 501 (also referred to as overlap area [1, 2]) between the frequency distribution $W_A(1)$ and the frequency distribution $W_A(2)$, wherein the following applies:

$$E_A(0)<R_0<E_A(1)<R_1<E_A(2).$$

According to the example selected in FIG. 5, the frequency distributions $W_A(0)$ and $W_A(1)$ do not have an overlap area and the frequency distributions $W_A(1)$ and $W_A(2)$ have the overlap area 501.

In the overlap area 501, it is possible, with a certain degree of probability, for the digital value 1 to be written to the memory and to be incorrectly read as digital value 2.

Since there is no overlap area between the frequency distribution $W_A(0)$ and the frequency distributions $W_A(1)$ and $W_A(2)$, it is possible, only with a low degree of probability, for the digital value 0 to be written to a memory cell and for a digital value 1 or 2 different from this value 0 to be read.

Addressing Data in a Memory

Figure 6:
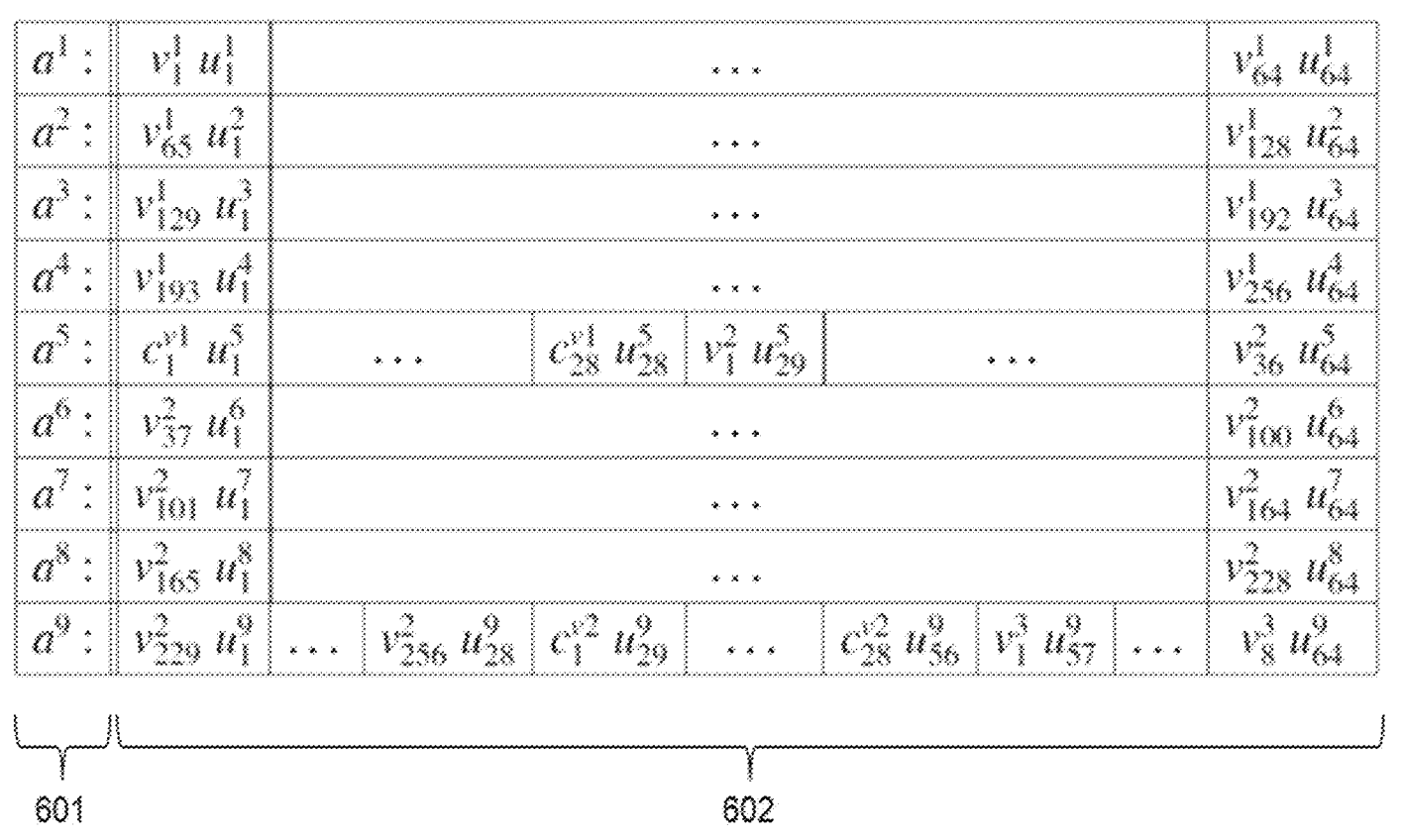

FIG. 6 shows an example diagram of a memory having an address 601 and data 602. Data 602 can be stored in 64 memory cells for each address 601, each memory cell being able to store four different digital values. FIG. 6 shows, by way of example, assignments of the memory for nine addresses $a^1, a^2, \ldots, a^9$.

Each of the addresses $a^i$, i=1, 2, . . . , 9, addresses 64 memory cells, four different binary-coded values being able to be stored in a memory cell. These four different values are represented as tuples xy of two binary values x and y. The bit x is the MSB and the bit y is the LSB of the tuple xy. A value stored in a memory cell therefore has an MSB and an LSB.

It is assumed, by way of example, that the LSB is stored with a higher reliability than the MSB.

In this example, the addresses $a^1$ to $a^4$ are assigned values as follows:

$a^1: v_1^1 u_1^1, \ldots, v_{64}^1 u_{64}^1;$ $a^2: v_{65}^1 u_1^2, \ldots, v_{128}^1 u_{64}^2;$ $a^3: v_{129}^1 u_1^3, \ldots, v_{192}^1 u_{64}^3;$ $a^4: v_{193}^1 u_1^4, \ldots, v_{256}^1 u_{64}^4.$ These are xy tuples with the bits u and v, the values of the v bits being stored as MSBs and the values of the u bits being stored as LSBs.

The bits $u^1$ stored with high reliability as LSBs under the address $a^1$ form a data word having the word width of 64 bits. This accordingly also applies to the LSBs $u^2$, $u^3$ and $u^4$ stored under the addresses $a^2$, $a^3$ and $a^4$ according to $u^1 = u_1^1, \ldots, u_{64}^1;$ $u^2 = u_1^2, \ldots, u_{64}^2;$ $u^3 = u_1^3, \ldots, u_{64}^3;$ $u^4 = u_1^4, \ldots, u_{64}^4.$ The bits $v^1 = v_1^1, \ldots, v_{256}^1$ which are stored with a lower reliability as MSBs under the addresses $a^1$, $a^2$, $a^3$ and $a^4$ form a first data word of the word width of 256 bits.

By way of example, the bits $v^1$ are protected by means of check bits of an error code having 28 check bits $c_1^{v1}, \ldots, c_{28}^{v1}$. The bits $u^1$, $u^2$, $u^3$ and $u^4$ are not protected by additional check bits in this example.

The 28 check bits $c_1^{v1}, \ldots, c_{28}^{v1}$ are stored as MSBs with 36 data bits $v_1^2, \ldots, v_{36}^2$ under the address $a^5$ and as LSBs with 64 data bits $u^5 = u_1^5, \ldots, u_{64}^5$.

In the error-free case, the bits $v_1^1, \ldots, v_{256}^1, c_1^{v1}, \ldots, c_{28}^{v1}$ form a code word of a first error code $Cod_1$.

An error code can generally be an error-detecting and/or error-correcting code.

For example, the error code $Cod_1$ may be a known 3-bit error-correcting BCH code over the Galois field $GF(2^9)$ with additional overall parity with a total of 28 check bits for 256 data bits, which also detects each 4-bit error.

$a^5: c_1^{v1} u_1^5, \ldots, c_{28}^{v1} u_{28}^5, v_1^2 u_{29}^5, \ldots, v_{36}^2 u_{64}^5;$ $a^6: v_{37}^2 u_1^6, \ldots, v_{100}^2 u_{64}^6;$ $a^7: v_{101}^2 u_1^7, \ldots, v_{164}^2 u_{64}^7;$ $a^8: v_{165}^2 u_1^8, \ldots, v_{228}^2 u_{64}^8;$ $a^9: v_{229}^2 u_1^9, \ldots, v_{256}^2 u_{28}^9, c_1^{v2} u_{29}^9, \ldots, c_{28}^{v2} u_{56}^9,$
$v_1^3 u_{57}^9, \ldots, v_8^3 u_{64}^9$ The bits $v^2 = v_1^2, \ldots, v_{256}^2$ which are stored under the addresses $a^5$, $a^6$, $a^7$, $a^8$ and $a^9$ as MSBs with lower reliability form a second data word of the word width 256. These 256 bits $v^2$ are protected by 28 check bits $c_1^{v2}, \ldots, c_{28}^{v2}$.

In the error-free case, the bits $v_1^2, \ldots, v_{256}^2, c_1^{v2}, \ldots, c_{28}^{v2}$ form a code word of the first error code $Cod_1$.

The bits $u^5$ stored under the address $a^5$ as LSBs with high reliability form a data word having the word width of 64 bits. This accordingly also applies to the LSBs $u^6$, $u^7$, $u^8$ and $u^9$ stored under the addresses $a^6$, $a^7$, $a^8$ and $a^9$ with $u^5 = u_1^5, \ldots, u_{64}^5;$ $u^6 = u_1^6, \ldots, u_{64}^6;$ $u^7 = u_1^7, \ldots, u_{64}^7;$ $u^8 = u_1^8, \ldots, u_{64}^8;$ $u^9 = u_1^9, \ldots, u_{64}^9.$ The bits $u^5$, $u^6$, $u^7$, $u^8$ and $u^9$ are not protected by additional check bits of an error code in this example.

Figure 7:
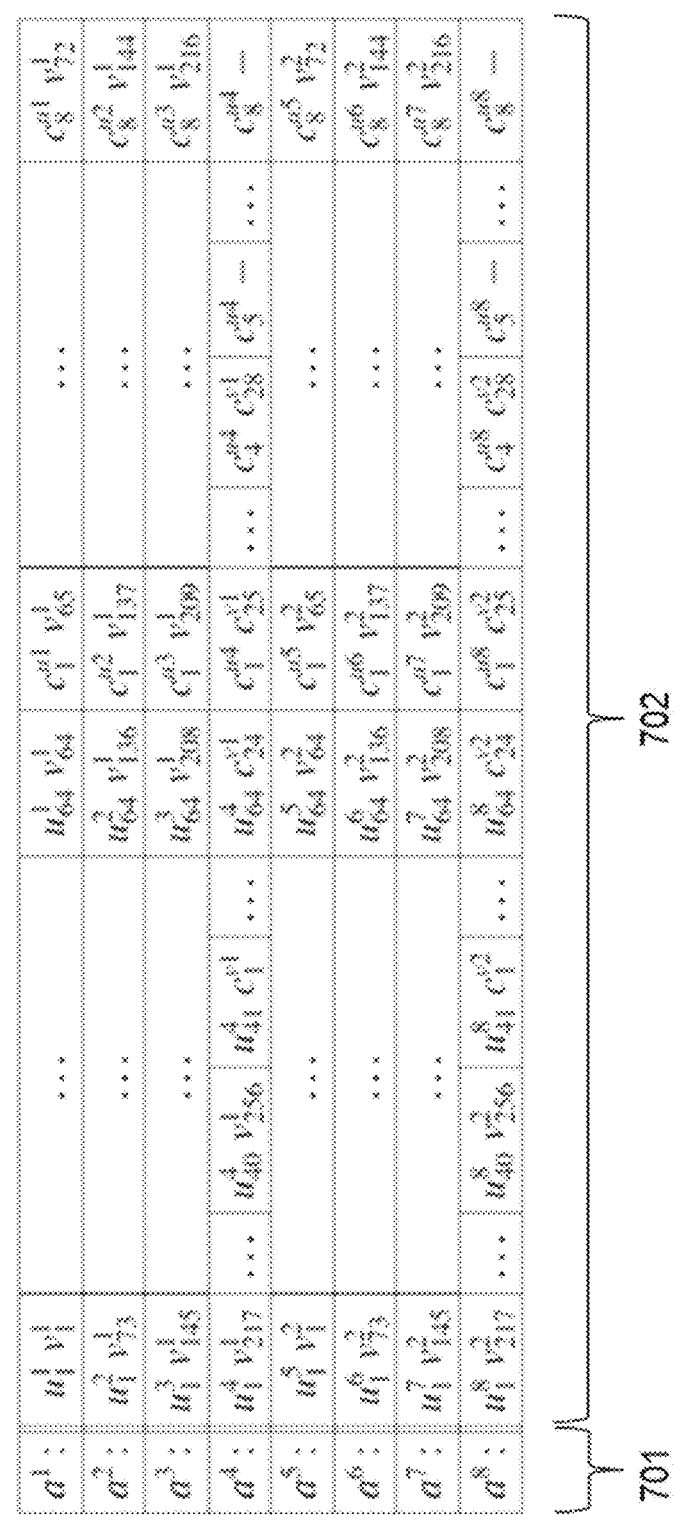

FIG. 7 shows an exemplary diagram of a memory having an address 701 and data 702. Data 702 can be stored in 72 memory cells for each address 701, each memory cell being able to store four different digital values. Each digital value stored for each memory cell can be stated as a tuple xy of two binary values x and y.

The bit x is the MSB and the bit y is the LSB of the tuple xy. A value stored in a memory cell therefore has an MSB and an LSB.

It is assumed by way of example that the MSB is stored with a higher reliability than the LSB.

72 memory cells are respectively available under the addresses $a^1$ to $a^8$. In this case, the addresses $a^1$ to $a^4$ are assigned values as follows:

$a^1: u_1^1 v_1^1, \ldots, u_{64}^1 v_{64}^1, c_1^{u1} v_{65}^1, \ldots, c_8^{u1} v_{72}^1;$ $a^2: u_1^2 v_{73}^1, \ldots, u_{64}^2 v_{136}^1, c_1^{u2} v_{137}^1, \ldots, c_8^{u2} v_{144}^1;$ $a^3: u_1^3 v_{145}^1, \ldots, u_{64}^3 v_{208}^1, c_1^{u3} v_{209}^1, \ldots, c_8^{u3} v_{216}^1;$ $a^4: u_1^4 v_{217}^1, \ldots, u_{40}^4 v_{256}^1, u_{41}^4 c_1^{v1}, \ldots, u_{64}^4 c_{24}^{v1},$
$c_1^{u4} c_{25}^{v1}, \ldots, c_4^{u4} c_{28}^{v1}, c_5^{u4} -, \ldots, c_8^{u4} -$ In the error-free case, the 256 data bits $v_1^1, \ldots, v_{256}^1$ and the 28 check bits $c_1^{v1}, \ldots, c_{28}^{v1}$ form a code word $v_1^1, \ldots, v_{256}^1, c_1^{v1}, \ldots, c_{28}^{v1}$ of the first error code $Cod_1$. These bits are stored as LSBs with lower reliability. In the example above, bits whose value assignments are not important are indicated with "–". The last four values of the LSBs therefore remain undetermined under the address $a^4$. These last four values can be assigned zeros or other binary values, for example.

The bits $u_1^1, \ldots, u_{64}^1, c_1^{u1}, \ldots, c_8^{u1};$ $u_1^2, \ldots, u_{64}^2, c_1^{u2}, \ldots, c_8^{u2};$ $$u_1^3, \ldots, u_{64}^3, c_1^{u3}, \ldots, c_8^{u3};$$

$$u_1^4, \ldots, u_{64}^4, c_1^{u4}, \ldots, c_8^{u4};$$

each form a code word of a second error code $Cod_2$ in the error-free case. In this case, for i=1, ..., 4, the bits $u_1^i, \ldots, u_{64}^i$ are data bits and the bits $c_1^{ui}, \ldots, c_8^{ui}$ are check bits.

Accordingly, the addresses $a^5$ to $a^8$ are assigned values as follows:

$$a^5: u_1^5 v_1^2, \ldots, u_{64}^5 v_{64}^2, c_1^{u5} v_{65}^2, \ldots, c_8^{u5} v_{72}^2;$$

$$a^6: u_1^6 v_{73}^2, \ldots, u_{64}^6 v_{136}^2, c_1^{u6} v_{137}^2, \ldots, c_8^{u6} v_{144}^2;$$

$$a^7: u_1^7 v_{145}^2, \ldots, u_{64}^7 v_{208}^2, c_1^{u7} v_{209}^2, \ldots, c_8^{u7} v_{216}^2;$$

$$a^8: u_1^8 v_{217}^2, \ldots, u_{40}^8 v_{256}^2, u_{41}^8 c_1^{v2}, \ldots, u_{64}^8 c_{24}^{v2}, c_1^{u8} c_{25}^{v2}, \ldots, c_4^{u8} c_{28}^{v2}, c_5^{u8} -, \ldots, c_8^{u8} -.$$

In the error-free case, the 256 data bits $v_1^2, \ldots, v_{256}^2$ and the 28 check bits $c_1^{v2}, \ldots, c_{28}^{v2}$ form a code word $$v_1^2, \ldots, v_{256}^2, c_1^{v2}, \ldots, c_{28}^{v2}$$

of the first error code $Cod_1$. These bits are stored as LSBs with lower reliability.
The bits $$u_1^5, \ldots, u_{64}^5, c_1^{u5}, \ldots, c_8^{u5};$$

$$u_1^6, \ldots, u_{64}^6, c_1^{u6}, \ldots, c_8^{u6};$$

$$u_1^7, \ldots, u_{64}^7, c_1^{u7}, \ldots, c_8^{u7};$$

$$u_1^8, \ldots, u_{64}^8, c_1^{u8}, \ldots, c_8^{u8}$$

each form a code word of the second error code $Cod_e$ in the error-free case. In this case, for i=5, ..., 8, the bits $u_1^i, \ldots, u_{64}^i$ are data bits $c_1^{ui}, \ldots, c_8^{ui}$ and the bits are check bits.

In the example cited here, the last four values of the LSB remain undetermined under the address $a^8$; these bits are indicated with the symbol "–".

Additional Memory

FIG. 8 shows an example diagram of a memory having an address 801 and data 802. The memory shown in FIG. 8 may be provided as an (additional) second memory. This second memory can be used, for example, to store the LSBs read from a first memory. For example, the LSBs may be stored with a lower reliability than the MSBs.

For example, LSBs which have possibly been incorrectly read can be corrected using a first error code $Cod_1$ and the corrected bits can then be stored in the second memory.

Optionally, the data bits of the LSBs can be corrected using the error code $Cod_1$ and check bits of a third error code $Cod_3$ can be formed using these corrected data bits. The data bits corrected using the code $Cod_1$ and the check bits formed therefrom using the third error code $Cod_3$ can be stored in the second binary memory.

It is assumed, for example, that FIG. 7 shows a corresponding first memory and FIG. 8 shows the second memory. It is assumed that the data stored in the first memory form possibly incorrect LSBs $$v_1^{1'}, \ldots, v_{256}^{1'}, v_1^{2'}, \ldots, v_{256}^{2'}, \ldots$$

of the word width 256 and that, for each of the 256 bits of data $v^{i'}$, there are 28 check bits of the first error code $Cod_1$ $$c_1^{v1'}, \ldots, c_{28}^{v1'}, c_1^{v2'}, \ldots, c_{28}^{v2'}, \ldots,$$

with the result that incorrect data bits are corrected, during reading from the first memory, with the aid of a correction unit using the first error code $Cod_1$, into corrected data bits $$v_1^{1cor}, \ldots, v_{256}^{1cor}, v_1^{2cor}, \ldots, v_{256}^{2cor}, \ldots$$

FIG. 8 illustrates that the data bits $v^{icor}$ corrected using the first error code are stored, together with the corresponding check bits $C^i$ of the third error code $Cod_3$, under the following addresses $A_1$ to $A_{32}$:

$$A_1: v_1^{1cor}, \ldots, v_{16}^{1cor};$$

$$A_2: v_{17}^{1cor}, \ldots, v_{32}^{1cor};$$

$$\vdots$$

$$A_{16}: v_{241}^{1cor}, \ldots, v_{256}^{1cor};$$

$$A_{17}: v_1^{2cor}, \ldots, v_{16}^{2cor};$$

$$\vdots$$

$$A_{32}: v_{241}^{2cor}, \ldots, v_{256}^{2cor}.$$

The check bits $$C^1 = C_1^1, \ldots, C_4^1;$$

$$C^2 = C_1^2, \ldots, C_4^2;$$

$$\vdots$$

$$C^{32} = C_1^{32}, \ldots, C_4^{32}$$

are determined with the aid of an encoder for the third error code $Cod_3$ in such a manner that, in the error-free case, the following bit combinations respectively form code words of the third error code $Cod_3$:

$$v_1^{1cor}, \ldots, v_{16}^{1cor}, C_1^1, \ldots, C_4^1;$$

$$\vdots$$

$$v_{241}^{1cor}, \ldots, v_{256}^{1cor}, C_1^{16}, \ldots, C_4^{16};$$

$$v_1^{2cor}, \ldots, v_{16}^{2cor}, C_1^{17}, \ldots, C_4^{17};$$

$$\vdots$$

$$v_{241}^{2cor}, \ldots, v_{156}^{2cor}, C_1^{32}, \ldots, C_4^{32}.$$

The second memory may comprise a volatile memory, for example an SRAM, an MRAM or the like, and/or a non-volatile memory. The first memory may comprise a non-volatile memory, for example a flash memory or the like. In particular, it is an option for the first memory and second memory to be any desired memories of the same type or of different types.

One option is for bits which are stored in the first memory and have a lower reliability to be read from the first memory with a large word width and to be corrected using the first error code $Cod_1$. In this case, the first error code $Cod_1$ may have a relatively large code distance in order to correct a multiplicity of errors. The errors can be corrected sequentially, as described, for example, for a BCH code in [Lin, S., Costello, D.: "Error Control Coding, Fundamentals and Applications", Pearson Education, London, 2004, pages 205 to 217].

In this case, it is advantageous that the number of check bits may be comparatively small for a large word width of the data bits. For example, 33 check bits may thus be required for a three-bit-error-correcting BCH code with 1024 data bits, whereas 27 check bits are already required for 256 data bits. The increase in the number of data bits by 768 data bits therefore only requires an increase in the number of check bits by 6. For example, n+1 check bits are required for a code having $2^n$ data bits in order to be able to correct a one-bit error. Therefore, n=10 and 11 check bits arise for 1024 data bits. If the intention is to correct t-bit errors, a t-bit-error-correcting BCH code can be used. For example, t·(n+1) check bits arise. For three-bit errors (t=3), 33 check bits are required for the 1024 data bits mentioned above and 3·(8+1)=27 check bits are required for 256 data bits.

It is also possible to use a so-called low-density parity code as the error code (for example for the first error code $Cod_1$) according to [Lin, S., Costello, D.: "Error Control Coding, Fundamentals and Applications", Pearson Education, London, 2004, pages 852 to 855].

It is possible to code the bits corrected using the first error code $Cod_1$ as code words of the third error code using the third error code $Cod_3$ and to store the code words in the second memory. It is possible to access the bits stored in the second memory quickly and reliably during ongoing operation of an application, for example, whereas errors which occur during storage in the second memory can be corrected using the third error code. It is likewise possible to update and/or restore the bits stored in the memories in different ways.

FIG. 9 shows an example diagram of a memory having an address 901 and data 902. The memory shown in FIG. 9 can be used as a first memory according to the statements above.

Data 902 can be stored in 8 memory cells for each address 901, each memory cell being able to store four different digital values. Each digital value stored for each memory cell can be stated as a tuple xy of two binary values x and y.

The bit x is the MSB and the bit y is the LSB of the tuple xy. A value stored in a memory cell therefore has an MSB (the bit x) and an LSB (the bit y).

It is assumed by way of example that the LSB is stored with a higher reliability than the MSB.

8 memory cells are respectively available under the addresses $a^1$ to $a^6$. In this case, the addresses $a^1$ to $a^6$ are assigned values as follows:

$$a^1: v_1 u_1^1, v_2 u_2^1, v_3 u_3^1, v_4 u_4^1, v_5 u_5^1, v_6 c_1^1, v_7 c_2^1, v_8 c_3^1;$$

$$a^2: v_1 u_1^2, v_2 u_2^2, v_3 u_3^2, v_4 u_4^2, v_5 u_5^2, v_6 c_1^2, v_7 c_2^2, v_8 c_3^2;$$

$$a^3: v_1 u_1^3, v_2 u_2^3, v_3 u_3^3, v_4 u_4^3, v_5 u_5^3, v_6 c_1^3, v_7 c_2^3, v_8 c_3^3;$$

$$a^4: v_9 u_1^4, v_{10} u_2^4, v_{11} u_3^4, v_{12} u_4^4, v_{13} u_5^4, v_{14} c_1^4, v_{15} c_2^4, v_{16} c_3^4;$$

$$a^5: v_9 u_1^5, v_{10} u_2^5, v_{11} u_3^5, v_{12} u_4^5, v_{13} u_5^5, v_{14} c_1^5, v_{15} c_2^5, v_{16} c_3^5;$$

$$a^6: v_9 u_1^6, v_{10} u_2^6, v_{11} u_3^6, v_{12} u_4^6, v_{13} u_5^6, v_{14} c_1^6, v_{15} c_2^6, v_{16} c_3^6.$$

In the error-free case, the data bits $u_1^1, \ldots, u_5^1$ and the check bits $c_1^1, c_2^1, c_3^1$ form a code word $u_1^1, \ldots, u_5^1, c_1^1, c_2^1, c_3^1$ of an error code $Cod_2$ for correcting possible errors of the LSBs. The error code $Cod_2$ may be a Hamming code for correcting one-bit errors, for example.

In the error-free case, the data bits $u_1^2, \ldots, u_5^2$ and the check bits $c_1^2, c_2^2, c_3^2$ form a code word $u_1^2, \ldots, u_5^2, c_1^2, c_2^2, c_3^2$ of the error code $Cod_2$ for correcting possible errors of the LSBs.

In the error-free case, the data bits $u_1^3, \ldots, u_5^3$ and the check bits $c_1^3, c_2^3, c_3^3$ form a code word $u_1^3, \ldots, u_5^3, c_1^3, c_2^3, c_3^3$ of the error code $Cod_2$ for correcting possible errors of the LSBs.

The bits $v_1, \ldots, v_8$ are each stored as MSBs under the addresses $a_1, a_2$ and $a_3$ and are therefore stored (redundantly) three times. In this case, a double repeat code can be used as the error code $Cod_1$ for correcting the MSBs, with the result that possibly incorrect values can be corrected, for example, by a majority decision.

In the error-free case, the data bits $u_1^4, \ldots, u_5^4$ and the check bits $c_1^4, c_2^4, c_3^4$ form a code word $u_1^4, \ldots, u_5^4, c_1^4, c_2^4, c_3^4$ of the error code $Cod_2$ for correcting possible errors of the LSBs.

In the error-free case, the data bits $u_1^5, \ldots, u_5^5$ and the check bits $c_1^5, c_2^5, c_3^5$ form a code word $u_1^5, \ldots, u_5^5, c_1^5, c_2^5, c_3^5$ of the error code $Cod_2$ for correcting possible errors of the LSBs.

In the error-free case, the data bits $u_1^6, \ldots, u_5^6$ and the check bits $c_1^6, c_2^6, c_3^6$ form a code word $u_1^6, \ldots, u_5^6, c_1^6, c_2^6, c_3^6$ of the error code $Cod_2$ for correcting possible errors of the LSBs.

The bits $v_9, \ldots, v_{16}$ are each stored as MSBs under the addresses $a_4, a_5$ and $a_6$ and are therefore stored (redundantly) three times. In this case, the double repeat code can be used as the error code $Cod_1$ for correcting the MSBs.

Exemplary Circuit Arrangements

Figure 10A:
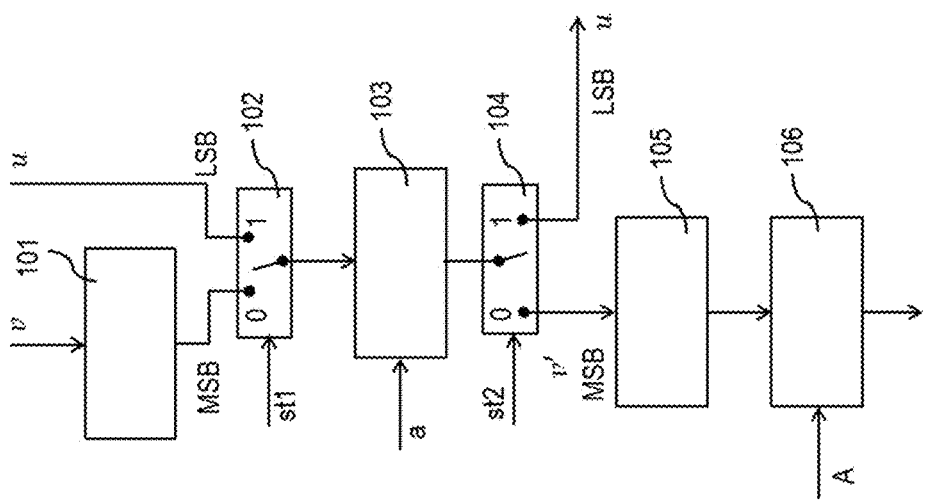
FIG. 10a shows an example circuit arrangement in which the LSB is stored in a memory cell of a (first) memory with a greater reliability than the MSB.

FIG. 10a shows an example circuit arrangement in which the LSB is stored in a memory cell of a memory 103 (first memory according to the statements above) with a higher reliability than the MSB.

Data bits v are present at an input of an encoder 101, at the output of which a code word of the error code $Cod_1$ with the data bits v is provided. The encoder 101 therefore determines the check bits c on the basis of the data bits v in such a manner that the bit combination v, c is a code word of the error code $Cod_1$ in the error-free case.

In this case, it is possible for the encoder 101 to code the data bits v in a parallel or sequential manner into code words of the error code $Cod_1$. These code words are stored as MSBs in the memory 103.

The output of the encoder 101 is connected to the 0 input of a multiplexer 102, the output of which is connected to the data input of the memory 103. Data bits u are present at the 1 input of the multiplexer 102 and are stored as LSBs in the memory 103.

The multiplexer 102 is controlled via a binary control signal st1; depending on the value of the control signal st1, the multiplexer 102 connects its 0 input or 1 input to its output.

By way of example, the MSBs are stored with a lower reliability than the LSBs in the memory cells of the memory 103.

The data bits v are bits of code words of the error code $Cod_1$. They are stored as MSBs in the memory 103. As a result of the coding using the error code $Cod_1$, additional check bits are generated and the lower reliability of the MSBs in the memory 103 is at least partially compensated for. Errors which occur when storing the MSBs can therefore be corrected by means of a correction unit 105 when reading the MSBs from the memory 103. The data bits corrected in this manner are then stored in a memory 106 (the second memory according to the statements above).

The memory 103 may be in the form of a multi-level memory which stores four digital values for each memory cell, for example.

The LSBs can be read quickly, for example by comparing them with only one reference value, with the result that the LSBs can be read reliably and quickly from the memory 103.

The reading of the MSBs requires a comparison with two reference values, which is more time-consuming in comparison with the LSBs. Furthermore, the storage of the MSBs is less reliable than the storage of the LSBs, which possibly requires error correction for multi-bit errors. For example, the error correction for multi-bit errors can be implemented sequentially.

After their error correction, the MSBs stored in the memory 103 can thus be stored in the memory 106. For example, the memory 106 is configured in such a manner that it enables fast read access. The memory 106 may be a volatile memory, for example an SRAM. The memory 103 may be in the form of a non-volatile memory.

The output of the memory 103 is connected to a demultiplexer 104. If the LSBs are read from the memory 103, the demultiplexer 104 connects its input to its 1 output, with the result that the LSBs u can be output. If the MSBs in the memory 103 are read, the demultiplexer 104 connects its input to its 0 output, with the result that the possibly incorrect MSBs v' which are read from the memory 103 are passed to the input of the correction unit 105. The correction unit 105 can correct the possibly incorrect bits v' into corrected data bits $v^{cor}$ using the error code $Cod_1$ and can store them in the memory 106.

The demultiplexer 104 is controlled via a binary control signal st2; depending on the value of the control signal st2, the demultiplexer 104 connects its input to the 0 output or to the 1 output.

The corrected data bits can then be read from the memory 106.

FIG. 10*a* also indicates that the memory 103 can be addressed by means of an address a and that the memory 106 can be addressed by means of an address A.

Figure 10B:
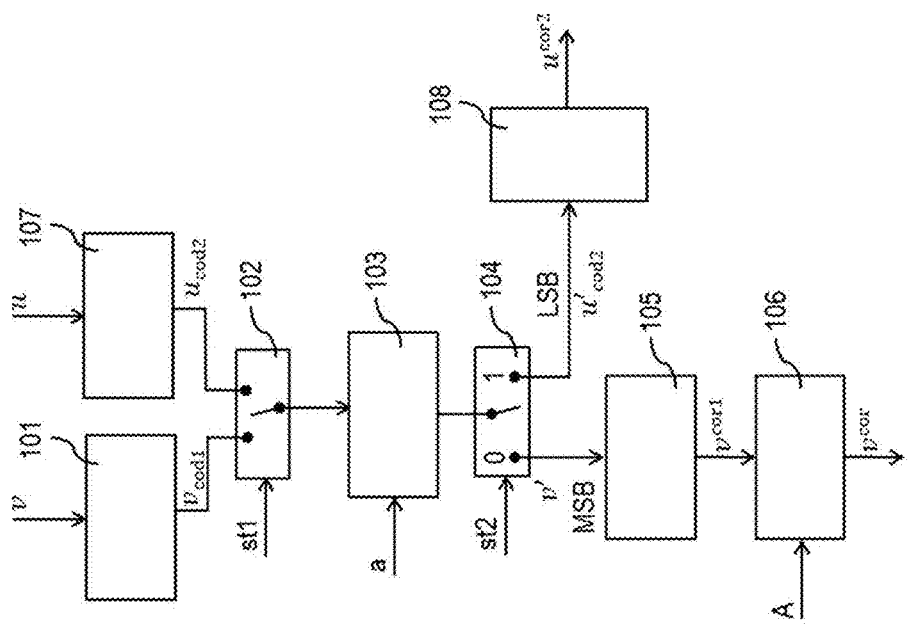
FIG. 10b shows an example circuit arrangement which is based on FIG. 10a and additionally also provides the LSBs with an error code and an associated correction possibility.

FIG. 10*b* shows an example circuit arrangement which is largely based on FIG. 10*a*. In this respect, identical reference symbols are used and reference is made to the explanation with respect to FIG. 10*a*.

In contrast to FIG. 10*a*, the data bits u which are stored as LSBs in the memory cells of the memory 103 are coded, before being stored, into a bit string $u_{cod2}$ by an encoder 107 using an error code $Cod_2$. In the error-free case, the bit string $u_{cod2}$ corresponds to a code word of the error code $Cod_2$. Reading errors during reading from the memory 103 or writing errors during writing to the memory 103 or other writing errors can therefore be detected and possibly corrected by virtue of the correction unit 108 determining whether the bits $u_{cod2}$ which are read from the memory and are possibly incorrect constitute a code word of the code $Cod_2$. If there is no code word, the incorrect bits $u'_{cod2}$ which have been stored as LSBs in the memory 103 can be corrected using a correction unit 108. For this purpose, the 1 output of the demultiplexer 104 is connected to the input of the correction unit 108. The data $u^{cor2}$ which have possibly been corrected are provided at the output of the correction unit 108.

Figure 10C:
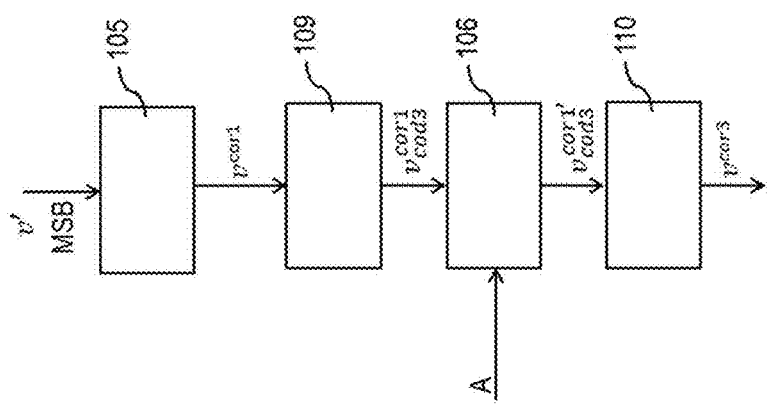
FIG. 10c shows an example circuit arrangement which is based on FIG. 10a or FIG. 10b, wherein a further encoder and a further correction unit are provided for the data stored in the second memory.

FIG. 10*c* shows an example circuit arrangement based on FIG. 10*a* or FIG. 10*b*, a further encoder 109 being provided between the correction unit 105 and the memory 106, which encoder codes corrected bits $v^{cor1}$ output by the correction unit 105 into code words $v_{Cod3}^{cor1}$ using an error code $Cod_3$, with the result that bits corrected using the error code $Cod_1$ and coded using the error code $Cod_3$ are stored in the binary memory 106.

Possibly incorrect bits $v_{Cod3}^{cor1'}$ can now be read from the memory 106 (the error may have occurred, for example, during storage, during reading or during storage by means of radiation or heating, for example) using a correction unit 110 which is connected downstream of the memory 106 and can be corrected into corrected bits $v^{cor3}$ using the error code $Cod_3$.

The error code $Cod_3$ may be, for example, a Hamming code, a Hsiao code or another code which makes it possible, in particular, to quickly correct the bits stored in the memory 106.

Figure 10D:
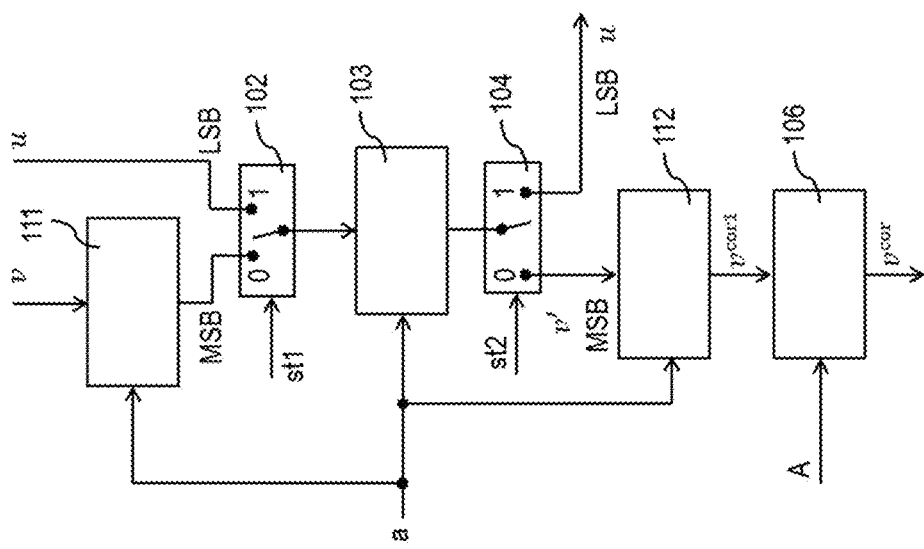
FIG. 10d shows an example circuit arrangement which is based on FIG. 10a, wherein the encoder and the correction unit also take into account the address of the first memory.

FIG. 10*d* shows an example circuit arrangement which is largely based on the circuit arrangement shown in FIG. 10*a*. Unlike the circuit arrangement shown in FIG. 10*a*, an encoder 111 is provided instead of the encoder 101 and a correction unit 112 is provided instead of the correction unit 105.

The encoder 111 has an additional input to which the address a of the memory 103 is passed. The encoder 111 provides, at its outputs, check bits which are based on the data bits v present at the encoder 111 and the address bits of the address a. In this case, the check bits can be determined in such a manner that the data bits, the address bits and the check bits form a code word of the error code $Cod_1$. Optionally, the address bits or bits derived from the address bits cannot be stored in the memory 103; it is also possible for the address bits or bits derived from the address bits to be stored in the memory 103. For example, the parity of the address bits can be stored in the memory 103.

The correction unit 112 likewise has (in comparison with the correction unit 105) an additional input to which the address a of the memory 103 is passed. The same address bits are therefore respectively available to the encoder 111 and to the correction unit 105 and can be accordingly taken into account during correction.

Figure 10E:
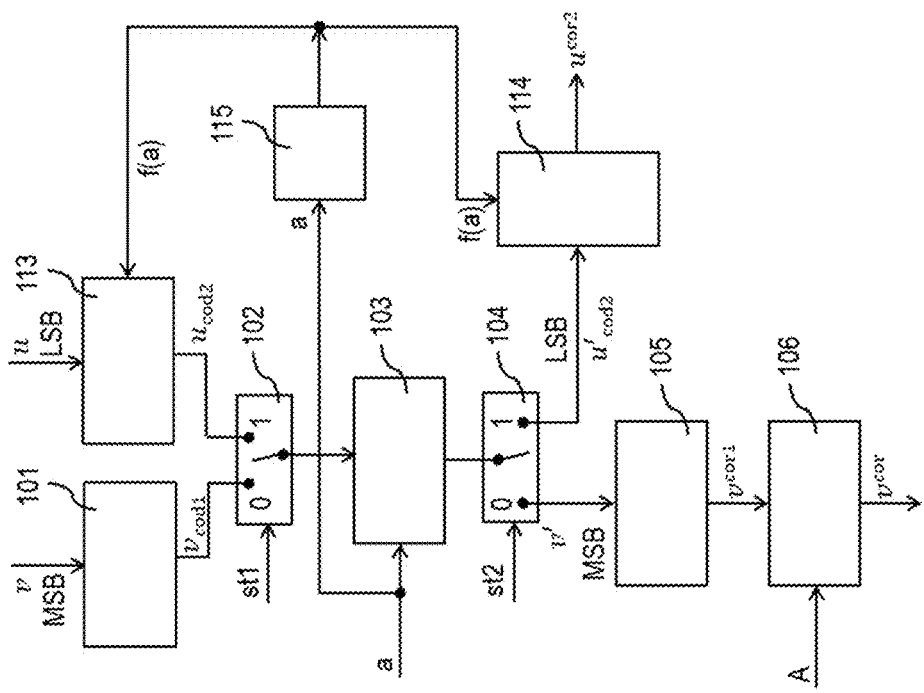
FIG. 10e shows an example circuit arrangement which is based on FIG. 10b, wherein the encoder and the correction unit of the LSBs also take into account a function derived from the address of the first memory.

FIG. 10*e* shows another example circuit arrangement which is largely based on the circuit arrangement shown in FIG. 10*b*. Unlike the circuit arrangement shown in FIG. 10*b*, an encoder 113 is provided instead of the encoder 107 and a correction unit 114 is provided instead of the correction unit 108.

The encoder 113 and the correction unit 114 each have an additional input at which bits are present, which bits are determined on the basis of the address a of the memory 103. In this context, a block 115 is provided, which block determines bits f(a) which are derived from the address bits of the address a and are then applied to the encoder 113 or to the correction unit 114.

The encoder 113 provides, at its outputs, check bits which are based on the data bits u present at the encoder 113 and the derived bits f(a). In this case, the check bits may be determined in such a manner that the data bits, the bits formed from the address bits and the check bits form a code word of the error code $Cod_2$. Optionally, the address bits or bits derived from the address bits cannot be stored in the memory 103.

The correction unit 114 forms corrected data bits on the basis of derived bits f(a).

The block 115 provides, for example, a uniquely determined function which maps the address bits of the address a to bits derived therefrom. For example, the function f(a) can determine the parity of the address bits of the address a.

Figure 10F:
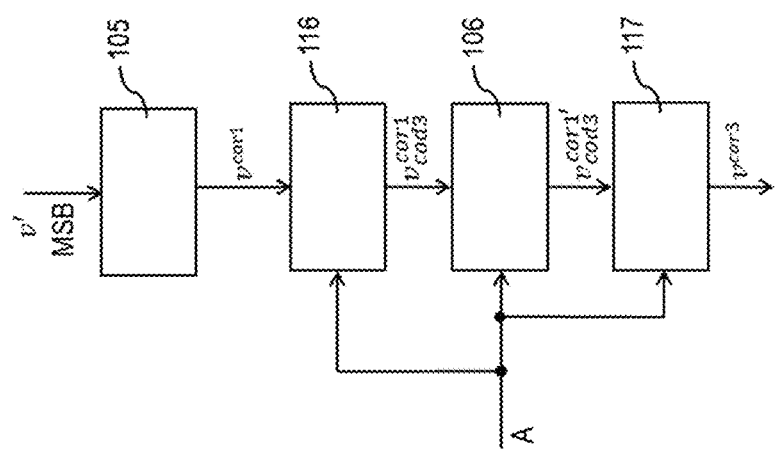
FIG. 10f shows an example circuit arrangement which is based on FIG. 10c, wherein the further encoder and the further correction unit also take into account the address of the second memory.

FIG. 10*f* shows a modification of the circuit arrangement from FIG. 10*c*. Unlike the circuit arrangement shown in FIG. 10*c*, an encoder 116 is provided instead of the encoder 109 and a correction unit 117 is provided instead of the correction unit 110 in FIG. 10*f*.

The encoder 116 and the correction unit 117 each have an additional input to which address bits of the address A of the memory 106 are applied. At its outputs, the encoder 116 provides check bits which can be determined on the basis of the data bits present at the encoder 116 and the address bits. The correction unit 117 forms corrected data bits on the basis of the provided address bits.

Further Advantages, Uses and Examples

The approach described here enables different fields of application. For example, it is possible to provide a flash memory array having a multiplicity of memory cells which are read using a sense amplifier. The memory cells each comprise a first area and a second area, the second area having a higher reliability than the first area. In this case, the sense amplifier can be operated in different modes.

For example, the sense amplifier can be operated in a first mode for reading the second area by carrying out, for example, a threshold value comparison with a reference value, which allows the physical values which have been read to be correctly assigned to the stored digital values in a very reliable manner. This is due to the fact that the frequency distributions of the physical values for the digital values stored in the second area of the memory cells do not have an overlap or have only a small overlap.

In a second mode of the sense amplifier, both areas (or only the first area) can be read. In this case, additional reference values can be used to distinguish the digital data which have been stored in the first area in a manner corresponding to the frequency distributions of physical values, and subsequent error detection and/or error correction can at least partially (or else completely) compensate for a possibly greater overlap of these frequency distributions.

The examples described here therefore make it possible to use memories with different reading windows in order to make it possible to quickly access an area of the memory cells which has a higher reliability than another area of the memory cells. The area of the memory cells with the reduced reliability can be read in combination with error correction, for example by means of buffering in a further memory, and the possible reading errors can therefore be at least partially corrected.

Another embodiment involves distributing an odd number of bits to the memory cell, some of these bits being stored with a higher reliability than the remainder of the bits. For example, three bits can be stored in the memory cells as follows: two bits are stored in the first area and one bit is stored in the second area (or vice versa). Reference is additionally made to the documents U.S. Pat. Nos. 8,935,590 and 9,203,437. The extent to which individual memory cells can assume at least three different states is explained there.

The invention claimed is:

1. A method of programming a memory cell in a memory cell array comprising a plurality of memory cells, wherein in the programming method each of the plurality of memory cells are configured to be programmed to one of four different memory states corresponding to one or four different physical characteristic values of the respective memory cells, and wherein for the memory cell array programmed according to the programming method a first state assigned a value 00 corresponds to a first physical characteristic value distribution having a first average physical characteristic value associated therewith, a second state assigned a value 10 corresponds to a second physical characteristic value distribution having a second average physical characteristic value associated therewith that is greater than the first average physical characteristic value, and wherein the first and second physical characteristic value distributions overlap one another, a third state assigned a value 01 corresponds to a third physical value distribution associated therewith having a third average physical characteristic value associated therewith that is greater than the second average physical characteristic value, and wherein the second and third physical characteristic value distributions do not overlap one another, a fourth state assigned a value 11 corresponds to a fourth physical characteristic value distribution having a fourth average physical characteristic value associated therewith that is greater than the third average physical characteristic value, and wherein the third and fourth physical characteristic value distributions overlap one another, the method comprising:
   erasing the memory cell by writing a physical value corresponding to the value 00 to the memory cell;
   determining whether the state to be written to the memory cell corresponds to 00, 10, 01 or 11;
   determining whether a least significant bit (LSB) of the determined state to be written to the memory cell is a 0, and:
   if so:
      taking no write action with respect to the LSB;
      determining whether a most significant bit (MSB) of the state to be written to the memory cell is a 0, and:
         if so, taking no write action with respect to the MSB, and
         if not, writing a physical characteristic value to the memory cell associated with the state 10 to the memory cell;
   if not:
      writing a physical characteristic value to the memory cell associated with the state 01 to the memory cell; and
      determining whether the MSB of the state to be programmed to the memory cell is a 0, and:
         if so, taking no write action with respect to the MSB, and
         if not, writing a physical characteristic value to the memory cell associated with the state 11 to the memory cell.

2. The method of claim 1, further comprising repeating the acts of programming a memory cell for a plurality of memory cells of the array.

3. The method of claim 2, wherein a first set of data is stored as LSBs in the plurality of memory cells in the memory array, and wherein a second set of data is stored as MSBs in the plurality of memory cells in the memory array.

4. The method of claim 3, wherein the first set of data has a higher reliability than the second set of data.

5. The method of claim 4, wherein, in an error-free case, a code word of a first error code is determined on the basis of the LSBs of a first plurality of memory cells in the memory array.

6. The method of claim 5, wherein, in an error-free case, a code word of a second error code is determined on the basis of MSBs of a second plurality of memory cells in the memory array.

7. The method of claim 6, wherein the first plurality of memory cells and the second plurality of memory cells comprise the same plurality of memory cells.

8. The method of claim 6, wherein the first error code has a higher correction power than the second error code.

9. The method of claim 1, further comprising reading the LSB of the memory cell, comprising:
   comparing the physical characteristic value of the memory cell to a reference value that lies between the second physical characteristic value distribution and the third physical characteristic value distribution that do not overlap; and concluding the state of the LSB is 0 if the physical characteristic value is less than the reference value, or concluding the state of the LSB is 1 otherwise.

10. A method of programming a memory cell in a memory cell array comprising a plurality of memory cells, wherein in the programming method each of the plurality of memory cells are configured to be programmed to one of four different memory states corresponding to one or four different physical characteristic values of the respective memory cells, and wherein for the memory cell array programmed according to the programming method a first state assigned a value 00 corresponds to a first physical characteristic value distribution having a first average physical characteristic value associated therewith, a second state assigned a value 10 corresponds to a second physical characteristic value distribution having a second average physical characteristic value associated therewith that is greater than the first average physical characteristic value, and wherein the first and second physical characteristic value distributions overlap one another, a third state assigned a value 01 corresponds to a third physical value distribution associated therewith having a third average physical characteristic value associated therewith that is greater than the second average physical characteristic value, and wherein the second and third physical characteristic value distributions do not overlap one another, a fourth state assigned a value 11 corresponds to a fourth physical characteristic value distribution having a fourth average physical characteristic value associated therewith that is greater than the third average physical characteristic value, and wherein the third and fourth physical characteristic value distributions overlap one another, the method comprising:
- erasing the memory cell by writing a physical value corresponding to the value 00 to the memory cell;
- determining whether the determined state to be written to the memory cell corresponds to 00, 10, 01 or 11;
- determining whether a most significant bit (MSB) of the state to be written to the memory cell is a 0, and:
    if so:
        taking no write action with respect to the MSB;
        determining whether a least significant bit (LSB) of the state to be written to the memory cell is a 0, and:
            if so, taking no write action with respect to the LSB, and
            if not, writing a physical characteristic value to the memory cell associated with the state 01 to the memory cell;
    if not:
        writing a physical characteristic value to the memory cell associated with the state 10 to the memory cell; and
        determining whether the LSB of the state to be programmed to the memory cell is a 0, and:
            if so, taking no write action with respect to the LSB, and
            if not, writing a physical characteristic value to the memory cell associated with the state 11 to the memory cell.

11. The method of claim 10, further comprising repeating the acts of programming a memory cell for a plurality of memory cells of the array.

12. The method of claim 11, wherein a first set of data is stored as LSBs in the plurality of memory cells in the memory array, and wherein a second set of data is stored as MSBs in the plurality of memory cells in the memory array.

13. The method of claim 12, wherein the first set of data has a higher reliability than the second set of data.

14. The method of claim 13, wherein, in an error-free case, a code word of a first error code is determined on the basis of the LSBs of a first plurality of memory cells in the memory array.

15. The method of claim 14, wherein, in an error-free case, a code word of a second error code is determined on the basis of MSBs of a second plurality of memory cells in the memory array.

16. The method of claim 15, wherein the first plurality of memory cells and the second plurality of memory cells comprise the same plurality of memory cells.

17. The method of claim 15, wherein the first error code has a higher correction power than the second error code.

18. The method of claim 10, further comprising reading the LSB of the memory cell, comprising:
- comparing the physical characteristic value of the memory cell to a reference value that lies between the second physical characteristic value distribution and the third physical characteristic value distribution that do not overlap; and
- concluding the state of the LSB is 0 if the physical characteristic value is less than the reference value, or concluding the state of the LSB is 1 otherwise.

* * * * *